US009176393B2

(12) United States Patent
Cloin et al.

(10) Patent No.: US 9,176,393 B2
(45) Date of Patent: Nov. 3, 2015

(54) LITHOGRAPHIC APPARATUS AND A METHOD OF OPERATING THE APPARATUS

(75) Inventors: Christian Gerardus Norbertus Hendricus Marie Cloin, Gennep (NL); Nicolaas Ten Kate, Almkerk (NL); Nicolaas Rudolf Kemper, Eindhoven (NL); Marco Koert Stavenga, Eindhoven (NL); Erik Henricus Egidius Catharina Eummelen, Eindhoven (NL); Michel Riepen, Veldhoven (NL); Olga Vladimirovna Elisseeva, Waalre (NL); Tijmen Wilfred Mathijs Gunther, Utrecht (NL); Michaël Christiaan Van Der Wekken, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 919 days.

(21) Appl. No.: 12/472,099

(22) Filed: May 26, 2009

(65) Prior Publication Data
US 2009/0296065 A1  Dec. 3, 2009

Related U.S. Application Data

(60) Provisional application No. 61/071,965, filed on May 28, 2008, provisional application No. 61/136,030, filed on Aug. 7, 2008.

(51) Int. Cl.
*G03F 7/20* (2006.01)
(52) U.S. Cl.
CPC ............ *G03F 7/70341* (2013.01); *G03F 7/707* (2013.01); *G03F 7/70716* (2013.01); *G03F 7/70733* (2013.01)

(58) Field of Classification Search
CPC . G03F 7/70341; G03F 7/707; G03F 7/70716; G03F 7/70733; G03F 7/7095; G03B 27/42
USPC ......................... 355/30, 52, 53, 55, 71, 72, 77
See application file for complete search history.

(56) References Cited

U.S. PATENT DOCUMENTS

| 4,346,164 | A | 8/1982 | Tabarelli et al. |
| 4,465,368 | A | 8/1984 | Matsuura et al. |

(Continued)

FOREIGN PATENT DOCUMENTS

| CN | 1894773 | 1/2007 |
| CN | 1918695 | 2/2007 |

(Continued)

OTHER PUBLICATIONS

English language translation of JP2007-266603A1.*

(Continued)

*Primary Examiner* — Toan Ton
*Assistant Examiner* — Mona M Sanei
(74) *Attorney, Agent, or Firm* — Pillsbury Winthrop Shaw Pittman LLP

(57) ABSTRACT

A lithographic projection apparatus is disclosed that includes a table, a shutter member, a fluid handling structure, and a fluid extraction system. The fluid handling structure may be configured to supply and confine liquid between a projection system and (i) a substrate, or (ii) the table, or (iii) a surface of the shutter member, or (iv) a combination selected from (i)-(iii). The surface of the shutter member may adjoin and be co-planar with a surface of the table. The surfaces of the shutter member and the table may be spaced apart by a gap. The fluid extraction system may be configured to remove liquid from the gap.

20 Claims, 10 Drawing Sheets

(56) References Cited

U.S. PATENT DOCUMENTS

| | | |
|---|---|---|
| 4,480,910 A | 11/1984 | Takanashi et al. |
| 4,509,852 A | 4/1985 | Tabarelli |
| 5,121,256 A | 6/1992 | Corle et al. |
| 5,243,195 A | 9/1993 | Nishi |
| 5,610,683 A | 3/1997 | Takahashi et al. |
| 5,650,840 A | 7/1997 | Taniguchi |
| 5,715,039 A | 2/1998 | Fukuda et al. |
| 5,825,043 A | 10/1998 | Suwa |
| 5,969,441 A | 10/1999 | Loopstra et al. |
| 6,137,561 A | 10/2000 | Imai |
| 6,262,796 B1 | 7/2001 | Loopstra et al. |
| 6,341,007 B1 | 1/2002 | Nishi et al. |
| 6,400,441 B1 | 6/2002 | Nishi et al. |
| 6,417,914 B1 | 7/2002 | Li |
| 6,665,054 B2 | 12/2003 | Inoue |
| 6,897,963 B1 | 5/2005 | Taniguchi et al. |
| 7,075,616 B2 | 7/2006 | Derksen et al. |
| 7,098,991 B2 | 8/2006 | Nagasaka et al. |
| 7,119,876 B2 | 10/2006 | Van Der Toorn et al. |
| 7,161,659 B2 | 1/2007 | Van Den Brink et al. |
| 7,199,858 B2 | 4/2007 | Lof et al. |
| 7,321,419 B2 | 1/2008 | Ebihara |
| 7,349,069 B2 | 3/2008 | Beems et al. |
| 7,388,649 B2 | 6/2008 | Kobayashi et al. |
| 7,405,811 B2 | 7/2008 | Beems et al. |
| 7,456,929 B2 | 11/2008 | Shibuta |
| 7,528,931 B2 | 5/2009 | Modderman |
| 7,589,820 B2 | 9/2009 | Nei et al. |
| 7,589,822 B2 | 9/2009 | Shibazaki |
| 7,982,857 B2 | 7/2011 | Nishii et al. |
| 8,018,575 B2 | 9/2011 | Ebihara |
| 8,027,027 B2 | 9/2011 | Ebihara |
| RE43,576 E | 8/2012 | Van Den Brink et al. |
| RE44,446 E | 8/2013 | Van Den Brink et al. |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2002/0196421 A1 | 12/2002 | Tanaka et al. |
| 2003/0030916 A1 | 2/2003 | Suenaga |
| 2003/0076482 A1 | 4/2003 | Inoue |
| 2003/0117596 A1 | 6/2003 | Nishi |
| 2003/0128350 A1 | 7/2003 | Tanaka |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0094125 A1 | 5/2005 | Arai |
| 2005/0100745 A1 | 5/2005 | Lin et al. |
| 2005/0106512 A1 | 5/2005 | Endo et al. |
| 2005/0110973 A1 | 5/2005 | Streefkerk et al. |
| 2005/0117135 A1 | 6/2005 | Verhoeven et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0136361 A1 | 6/2005 | Endo et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175776 A1 | 8/2005 | Streefkerk et al. |
| 2005/0175940 A1 | 8/2005 | Dierichs |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219488 A1 | 10/2005 | Nei et al. |
| 2005/0219499 A1 | 10/2005 | Zaal et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237510 A1 | 10/2005 | Shibazaki |
| 2005/0243292 A1 | 11/2005 | Baselmans |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0259236 A1 | 11/2005 | Straaijer |

(56) References Cited

U.S. PATENT DOCUMENTS

| | | |
|---|---|---|
| 2005/0263068 A1 | 12/2005 | Hoogendam et al. |
| 2005/0264778 A1 | 12/2005 | Lof et al. |
| 2005/0270505 A1 | 12/2005 | Smith |
| 2006/0038968 A1 | 2/2006 | Kemper et al. |
| 2006/0061747 A1 | 3/2006 | Ishii |
| 2006/0082741 A1 | 4/2006 | Van Der Toorn et al. |
| 2006/0087630 A1* | 4/2006 | Kemper et al. ............... 355/30 |
| 2006/0103820 A1 | 5/2006 | Donders et al. |
| 2006/0114445 A1 | 6/2006 | Ebihara |
| 2006/0119809 A1 | 6/2006 | Verhagen et al. |
| 2006/0126037 A1 | 6/2006 | Jansen et al. |
| 2006/0132733 A1 | 6/2006 | Modderman |
| 2006/0158627 A1 | 7/2006 | Kemper et al. |
| 2006/0238730 A1* | 10/2006 | Nei et al. ................... 355/53 |
| 2007/0109521 A1* | 5/2007 | Nishii et al. ................ 355/72 |
| 2007/0127006 A1 | 6/2007 | Shibazaki |
| 2007/0211234 A1 | 9/2007 | Ebihara |
| 2007/0211235 A1 | 9/2007 | Shibazaki |
| 2007/0216881 A1 | 9/2007 | Van Der Schoot et al. |
| 2007/0229786 A1 | 10/2007 | Kemper et al. |
| 2007/0247607 A1 | 10/2007 | Shibazaki |
| 2008/0002163 A1 | 1/2008 | Fujiwara et al. |
| 2008/0111984 A1 | 5/2008 | Shibuta |
| 2008/0117393 A1 | 5/2008 | Fujiwara et al. |
| 2009/0109413 A1 | 4/2009 | Shibazaki et al. |
| 2009/0296056 A1* | 12/2009 | Mondt et al. ................ 355/30 |
| 2010/0182584 A1 | 7/2010 | Shibazaki |
| 2011/0080574 A1 | 4/2011 | Nishii et al. |

FOREIGN PATENT DOCUMENTS

| | | |
|---|---|---|
| CN | 101076877 | 11/2007 |
| DE | 221 563 A1 | 9/1983 |
| DE | 224 448 A1 | 7/1985 |
| EP | 1 041 357 A1 | 10/2000 |
| EP | 1 220 037 | 7/2002 |
| EP | 1 306 592 A2 | 5/2003 |
| EP | 1420299 A2 | 5/2004 |
| EP | 1420300 A2 | 5/2004 |
| EP | 1 429 188 | 6/2004 |
| EP | 1 486 827 A2 | 12/2004 |
| EP | 1 494 267 A1 | 1/2005 |
| EP | 1 486 027 A3 | 3/2005 |
| EP | 1 571 695 | 9/2005 |
| EP | A 1 635 382 A1 | 3/2006 |
| EP | 1 699 073 A1 | 9/2006 |
| EP | 1 713 113 A1 | 10/2006 |
| EP | 1 715 384 A2 | 10/2006 |
| EP | 1 837 896 A1 | 9/2007 |
| EP | 1 860 684 | 11/2007 |
| JP | A 57-117238 | 7/1982 |
| JP | A 57-153433 | 9/1982 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-065603 | 3/1992 |
| JP | A 4-305915 | 10/1992 |
| JP | A 4-305917 | 10/1992 |
| JP | A 5-021314 | 1/1993 |
| JP | A 5-62877 | 3/1993 |
| JP | A 6-124873 | 5/1994 |
| JP | A 7-176468 | 7/1995 |
| JP | A 7-220990 | 8/1995 |
| JP | A-7-335748 | 12/1995 |
| JP | A 8-037149 | 2/1996 |
| JP | A 8-316125 | 11/1996 |
| JP | A 10-163099 | 6/1998 |
| JP | A 10-214783 | 8/1998 |
| JP | A 10-255319 | 9/1998 |
| JP | A 10-303114 | 11/1998 |
| JP | A 10-340846 | 12/1998 |
| JP | A 11-016816 | 1/1999 |
| JP | A 11-176727 | 7/1999 |
| JP | A 2000-58436 | 2/2000 |
| JP | A 2000-505958 | 5/2000 |
| JP | A 2000-164504 | 6/2000 |
| JP | A 2000-511704 | 9/2000 |
| JP | A 2001-160530 | 6/2001 |
| JP | A 2001-241439 | 9/2001 |
| JP | A 2001-267239 | 9/2001 |
| JP | A 2002-014005 | 1/2002 |
| JP | A 2002-134390 | 5/2002 |
| JP | A 2002-305140 | 10/2002 |
| JP | A 2003-17404 | 1/2003 |
| JP | A 2003-249443 | 9/2003 |
| JP | A 2004-165666 | 6/2004 |
| JP | A 2004-207696 | 7/2004 |
| JP | A 2004-207711 | 7/2004 |
| JP | A 2004-289128 | 10/2004 |
| JP | 2007-201452 | 8/2007 |
| JP | 2007-208279 | 8/2007 |
| JP | 2007-251165 | 9/2007 |
| JP | 2007-266603 | 10/2007 |
| KR | 2005-0062665 | 6/2005 |
| KR | 10-2005-0121723 | 12/2005 |
| KR | 10-2006-0120693 | 11/2006 |
| WO | WO 98/40791 | 9/1998 |
| WO | WO 99/23692 | 5/1999 |
| WO | 99/49504 A1 | 9/1999 |
| WO | WO 02/091078 A1 | 11/2002 |
| WO | WO 03/077037 A1 | 9/2003 |
| WO | WO 03/085708 A1 | 10/2003 |
| WO | WO 2004/019128 A2 | 3/2004 |
| WO | WO 2004/053953 A1 | 6/2004 |
| WO | WO 2004/053955 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093160 A2 | 10/2004 |
| WO | WO 2004/093169 A2 | 10/2004 |
| WO | WO 2004/095135 A2 | 11/2004 |
| WO | 2004/114380 | 12/2004 |
| WO | WO 2004/105107 | 12/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 A2 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/048328 A1 | 5/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005057636 A1 * | 6/2005 |
| WO | 2005/064405 | 7/2005 |
| WO | WO 2005/062128 A2 | 7/2005 |
| WO | WO 2005/062351 A1 | 7/2005 |
| WO | WO 2005/064400 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |

(56) References Cited

FOREIGN PATENT DOCUMENTS

| WO | WO 2005/074606 A2 | 8/2005 |
| --- | --- | --- |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |
| WO | 2006/049134 | 5/2006 |
| WO | WO 2006064851 A1 * | 6/2006 |

OTHER PUBLICATIONS

Japanese Office Action mailed Jul. 22, 2011 in corresponding Japanese Patent Application No. 2009-126877.

Korean Office Action dated Feb. 23, 2011 in corresponding Korean Patent Application No. 10-2009-0047171.

Chinese Office Action dated Mar. 29, 2011 in corresponding Chinese Patent Application No. 200910159503.2.

Korean Office Action dated Jun. 16, 2011 in corresponding Korean Patent Application No. 10-2011-0038076.

European Search Report for European Application No. 09161123.6-2222 dated Oct. 5, 2009.

Lin, B.J., "Semiconductor Foundry, Lithography, and Partners", Proceedings of SPIE, vol. 4688, pp. 11-24, 2002.

Switkes, M., et al., "Resolution Enhancement of 157nm Lithography by Liquid Immersion", Proceedings of SPIE, vol. 4691, pp. 459-465, 2002.

Switkes, M., et al., "Resolution Enhancement of 157nm Lithography by Liquid Immersion", J. Microlith., Microfab., Microsyst., vol. 1, No. 3, pp. 1-4, 2002.

Owa, Soichi, et al., "Nikon F2 Exposure Tool", slides 1-25, $3^{rd}$ 157nm Symposium, Sep. 4, 2002.

Owa, Soichi, et al., "Immersion Lithography; its Potential Performance and Issues". Proceedings of SPIE, vol. 5040, pp. 724-733, 2003.

Owa, Soichi, et al., "Potential Performance and Feasibility of Immersion Lithography", slides 1-33, NGL Workshop 2003, Jul. 2003.

Owa, Soichi, et al., "Update on 193nm Immersion Exposure Tool", slides 1-38, Immersion Workshop 2004, Jan. 27, 2004.

Owa, Soichi, et al., "Update on 193nm Immersion Exposure Tool", slides 1-51, Litho Forum, Jan. 28, 2004.

* cited by examiner

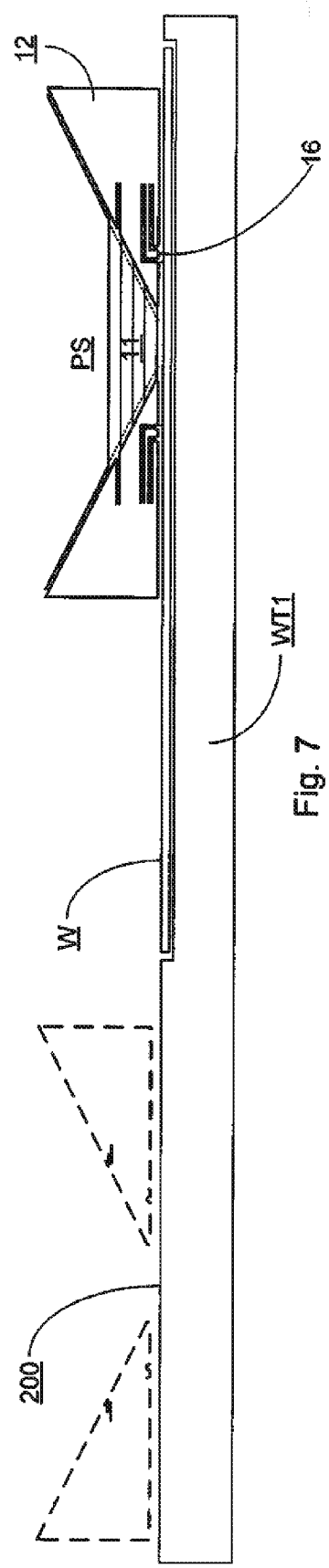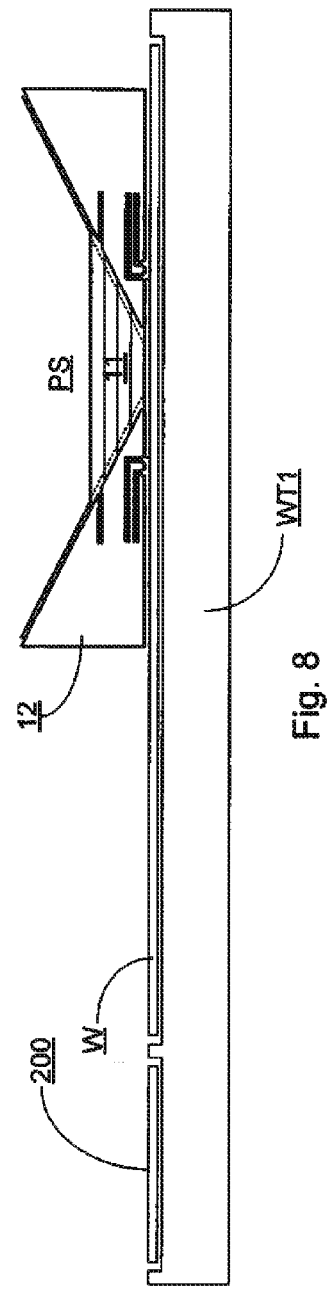

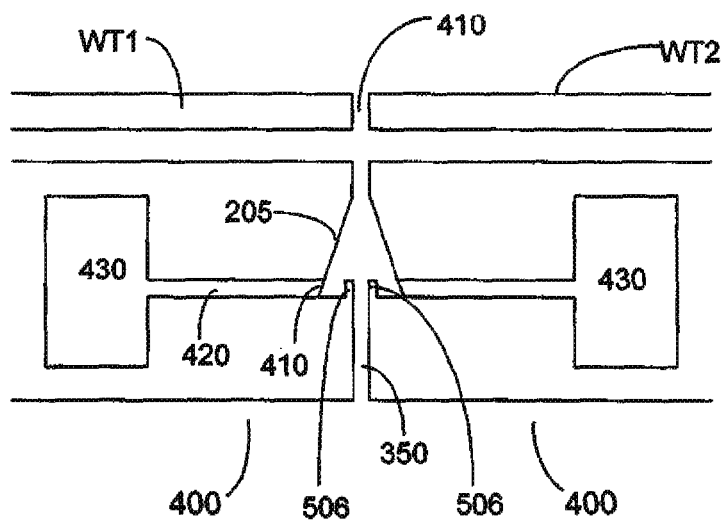
Fig. 16
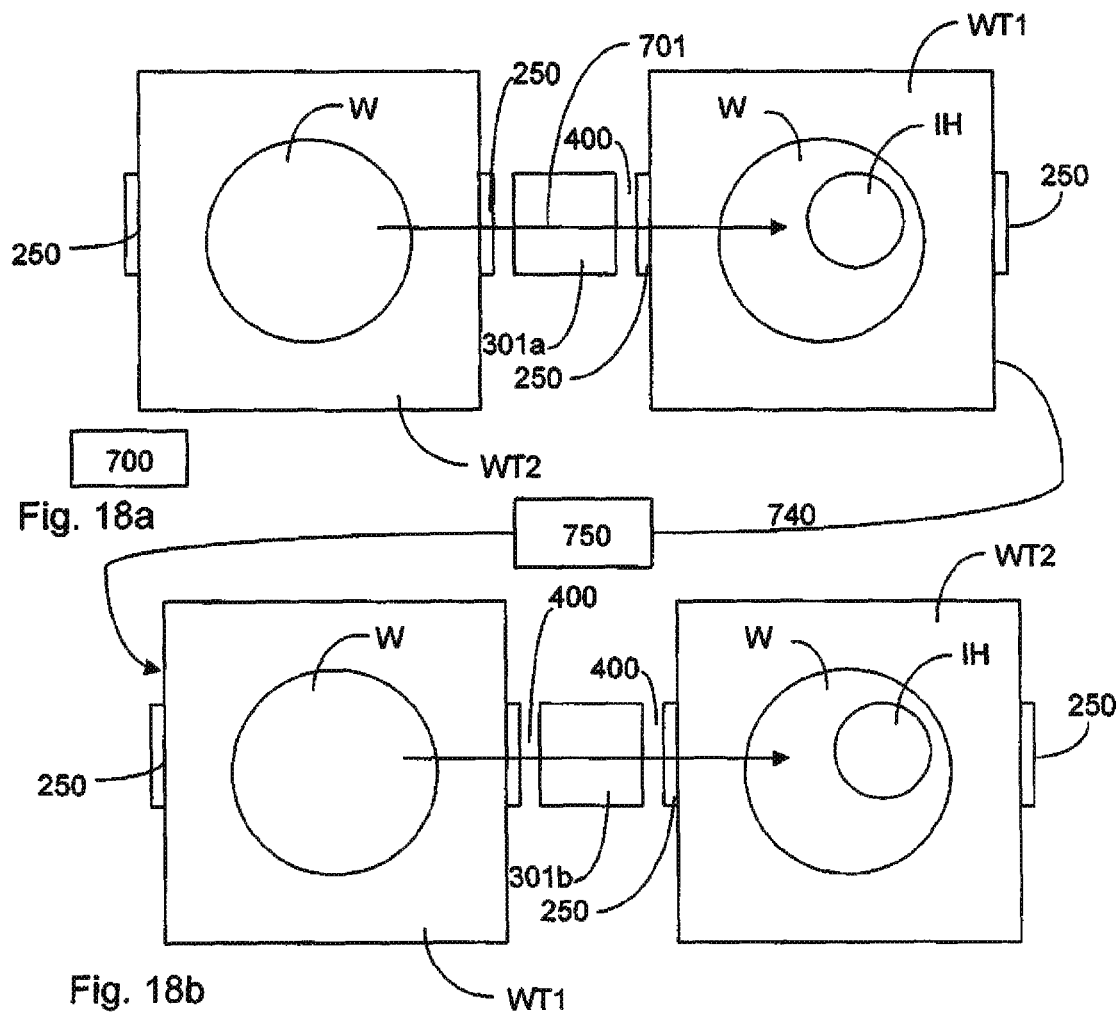
Fig. 18a
Fig. 18b

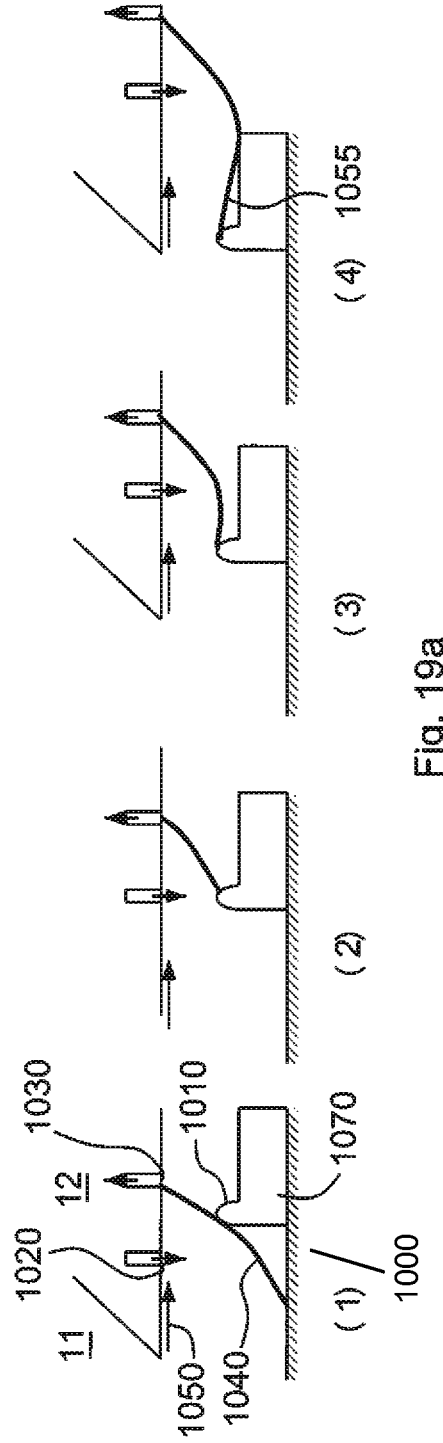
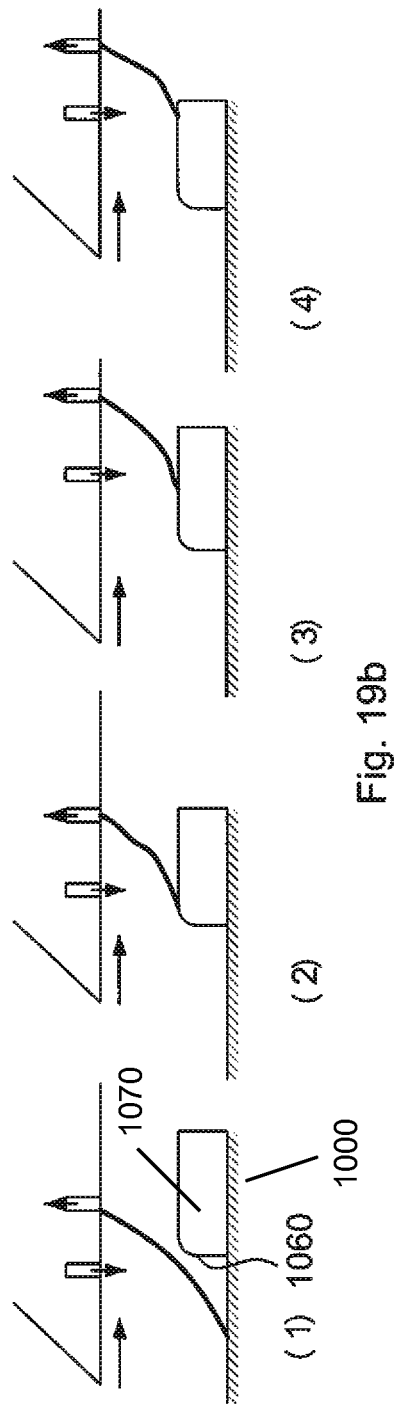
Fig. 19a
Fig. 19b

LITHOGRAPHIC APPARATUS AND A METHOD OF OPERATING THE APPARATUS

This application claims priority and benefit under 35 U.S.C. §119(e) to U.S. Provisional Patent Application No. 61/071,965, entitled "Lithographic Apparatus and a Method of Operating the Apparatus", filed on May 28, 2008, and to U.S. Provisional Patent Application No. 61/136,030, entitled "Lithographic Apparatus and a Method of Operating the Apparatus", filed on Aug. 7, 2008. The content of each of the foregoing applications is incorporated herein in its entirety by reference.

FIELD

The present invention relates to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element. Liquid is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Liquid is supplied as represented by arrows directed away from the rectangular features in FIG. 3. Liquid is removed as represented by arrows directed towards the rectangular features in FIG. 3.

A further immersion lithography solution with a localized liquid supply system is shown in FIG. 4. Liquid is supplied (as shown by arrows in FIG. 4) by two groove inlets IN on either side of the projection system PS and is removed (as shown by arrows in FIG. 4) by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

The immersion system may be a fluid handling system or apparatus. In one embodiment the fluid handling system may supply immersion fluid or liquid and therefore be a fluid or liquid supply system. In an embodiment the fluid handling system may confine fluid or liquid and thereby be a fluid or liquid confinement system. In an embodiment the fluid handling system may provide a barrier to fluid or liquid and thereby be a barrier member. In an embodiment the fluid handling system may create or use a flow of gas, for example to help in handling liquid. In an embodiment immersion liquid rather than immersion fluid is used. In that case the fluid handling system may be a liquid handling system. The fluid handling system is located between the projection system and the substrate table.

SUMMARY

After exposure of a substrate in an immersion lithographic apparatus, the substrate table is moved away from its exposure position to a position in which the substrate may be removed and replaced by a different substrate. This is known as substrate swap. In a two stage lithographic apparatus, for example ASML's "Twinscan" machine, the substrate tables swap position, such that one of the substrate tables takes the place of another substrate table under the projection system. When, for example, a substrate is processed and its substrate table is swapped with another substrate table, the substrate is removed and replaced, i.e., the substrate is swapped.

It is desirable to keep immersion liquid flowing in the fluid handling system during substrate and/or substrate table swap. However, when a substrate table is moved away, there may be a risk of losing liquid from the fluid handling system. To prevent the loss of liquid, a shutter member may be positioned under a liquid confinement structure of the fluid handling system. A shutter may be a part of the substrate table away from the substrate holder of the table, as shown in FIG. 7. The shutter member may be a separate table, such as a measurement table which might not support a substrate. In another embodiment, the shutter member may be a closing member, such as a closing disk. The closing disk is temporarily mounted under the fluid handling system or liquid confinement structure, and released when the substrate swap is finished. See FIGS. 8 to 9 for closing disk examples.

Before substrate and/or substrate table swap the closing disk is located on the substrate table and is maneuvered under the fluid handling system or liquid confinement structure to be picked up, for example, by a mechanism of the fluid handling system or liquid confinement structure. In an embodiment, the closing disk may be held by the fluid handling system or liquid confinement structure between the end of exposure of the previous substrate and the beginning of exposure of the next substrate. The time available for this time period may be as much as four seconds. During the swap, the liquid and gas flows (for example extracting under-pressures and gas knife flows) through fluid handling system or liquid confinement structure are adapted to enable pick up of the closing disk. However, undesirably the changes in liquid and gas supply may cause temperature changes in the fluid handling system or liquid confinement structure which may affect overlay.

In addition, physical contact of the closing disk and the fluid handling system or liquid confinement structure may be undesirable and may be avoided. Some contact may still happen and such contact may cause contamination, such as particle contamination, which may lead to defects on the processed wafer.

A retractable extension or bridge between two substrate tables, also known as a "swap bridge" (SWB), is another form of shutter member. It is a temporary extension of a substrate table which enables substrate tables to exchange positions, for example under the projection system, without the physical contact between the fluid handling system or liquid confinement structure and the shutter member. A top surface of the bridge adjoins and is co-planar with a top surface of the substrate table. The retractable bridge enables the fluid flow of the fluid handling system or liquid confinement structure to be maintained. See FIGS. 10 and 11 for examples. Thus the sources of contamination and the temperature fluctuations of the fluid handling system or liquid confinement structure are further reduced and are desirably minimized. In using the retractable bridge, the defectivity and overlay performance of an immersion system may improve. Because in this arrangement it is not necessary to pick-up and put down a closing disk, the time period for substrate swap, between exposures of successive substrates, may be reduced. So throughput may increase.

The retractable bridge comprises a supporting surface, also known as a "bridge deck", a docking system and a lift system. The supporting surface is the surface that prevents liquid from being lost from the fluid handling system or liquid confinement structure. The docking system is configured to keep the supporting surface connected to the substrate table during substrate swap, with the supporting surface substantially in the plane of the surface of the substrate table. The lift system is constructed and arranged to move, i.e. to extend and retract, the retractable bridge into position for substrate swap.

Because the retractable bridge is retractable and helps to close the gap between the substrate tables there may well be one or more small gaps between the different parts, in the surface opposing the fluid handling system or liquid confinement structure, for example between the supporting surface and the substrate table. These gaps are present to prevent direct contact between the retractable bridge and the substrate table. Direct contact between these components or indeed between the tables (such as two substrate tables or a substrate table and a measurement table) is a source of machine damage and/or position errors. Through these gaps immersion liquid, such as water, may be lost from the liquid provided by or confined in the fluid handling system or liquid confinement structure. The lost liquid may fall through a gap onto components below. The lost liquid can cause damage and contamination to these components.

There are other gaps over which the liquid provided by or confined in the liquid handling system or confinement structure must pass. For example, substrate swap can take place by movement of one table followed by another table under the projection system and liquid handling structure or confinement structure without the use of a retractable extension or bridge. For example, a first substrate table may be directly followed by a second substrate table or a measurement table without any (moveable) structure between the two tables. Another gap may be present between a top surface of the substrate table and the substrate itself. It is usual for a substrate to sit in a recess in the top surface of the substrate table so that the top surface of the substrate table is substantially co-planar with the top surface of the substrate. In order to account for variations in substrate size (i.e. tolerance) the recess has a slightly larger width dimension than that of the substrate. Therefore a gap exists between the top surface of the substrate table and the top surface of the substrate.

In a fluid handling system or liquid confinement structure, liquid is confined to a space, for example within a confinement structure by the body of the structure, the underlying surface (e.g. a substrate table, substrate supported on the substrate table, shutter member and/or measurement table) and a liquid meniscus between the fluid handling system or liquid confinement structure and the underlying structure. The underlying surface, including, for example the retractable bridge during substrate swap, moves relative to the meniscus, such as, under it. During such movement, for example, it is possible for bubbles to become enclosed by the meniscus, for example from gas entering from the gaps next to the components of the retractable bridge.

It is therefore desirable to provide a system for dealing with the situation of a gap passing relative to a liquid handling structure or confinement system in an immersion apparatus, for example, under liquid handling structure or confinement system. It is further desirable to maintain, or minimize the reduction in, the speed of relative motion between the liquid confinement structure and the underlying surface during substrate and/or substrate table swap. Lowering the speed may reduce throughput. It is desirable to reduce the size and/or number of bubbles enclosed by the meniscus.

In an aspect of an invention there is provided an immersion lithographic apparatus comprising: a substrate table configured to support a substrate; a shutter member having a top surface, wherein, in use, the top surface is substantially co-planar with a surface of the substrate table and the surfaces of the shutter member and the substrate table are spaced apart by a gap; a fluid handling structure configured to supply and confine liquid between a projection system and (i) the substrate, or (ii) the substrate table, or (iii) a surface of the shutter member, or (iv) any combination selected from (i)-(iii); and a fluid extraction system configured to remove liquid from the gap through an extraction opening in a side wall surface of the shutter member and/or of the substrate table.

According to an embodiment of the invention, there is provided an immersion lithographic apparatus comprising a substrate table configured to support a substrate; a fluid handling structure configured to supply and confine liquid between a projection system configured to direct a patterned beam of radiation at a target portion of the substrate, and the substrate, or the substrate table, or both; and a fluid extraction system configured to remove liquid from a gap between the substrate and the substrate table, and comprising a plurality of extraction openings to extract liquid, the openings being defined in a surface of the gap.

According to an embodiment of the invention, there is provided an immersion lithographic apparatus comprising a substrate table configured to support a substrate; a fluid handling structure configured to supply and confine liquid between a projection system configured to direct a patterned beam of radiation at a target portion on the substrate, and an underlying substantially planar surface, the underlying surface comprising two parts having a gap defined therebetween; and a fluid extraction system constructed and arranged to remove liquid from the gap, and comprising a plurality of openings arranged in a pattern.

According to an embodiment of the invention, there is provided a lithographic apparatus comprising: a projection system; a first object; a second object; and a controller configured to control movement of the first and second objects in the apparatus such that when the first object replaces the second object under the projection system both objects always move in substantially the same direction and when the second object replaces the first object under the projection system both objects always move in substantially the same direction.

According to an embodiment of the invention, there is provided a device manufacturing method comprising using a fluid handling structure to supply and confine liquid between a projection system configured to direct a patterned beam of radiation at a target portion of a substrate, and an underlying substantially planar surface, the underlying surface comprising two parts having a gap defined therebetween, and removing liquid from the gap using a fluid extraction system comprising a plurality of openings arranged in a pattern.

According to an embodiment of the invention, there is provided a device manufacturing method comprising using a fluid handling structure to supply and confine liquid between a projection system configured to direct a patterned beam of radiation at a target portion of a substrate, and an underlying substantially planar surface, the underlying surface comprising two parts having a gap defined therebetween, and moving the gap under the fluid handling structure a plurality of times, the moving only being in a first direction.

In an embodiment of the invention, the fluid extraction system used with a retractable bridge may solve the problem of leakage during substrate swap. The fluid extraction system may prevent the entrapment of bubbles in the immersion liquid confined by the fluid handling structure during substrate swap.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts, in cross-section, a form of shutter member which is the surface of a substrate table;

FIG. 8 depicts, in cross-section, a shutter member in the form of a closing disk;

FIG. 16 illustrates, in cross-section, fluid extraction systems in adjacent substrate tables;

FIGS. 18a and 18b illustrates, in plan, an embodiment in which substrate swap is effected by movement of a shutter member under the projection system in one direction only; and FIGS. 19a and 19b illustrate the behavior of a meniscus on crossing a sharp edge and a curved edge.

DETAILED DESCRIPTION

Figure 1:
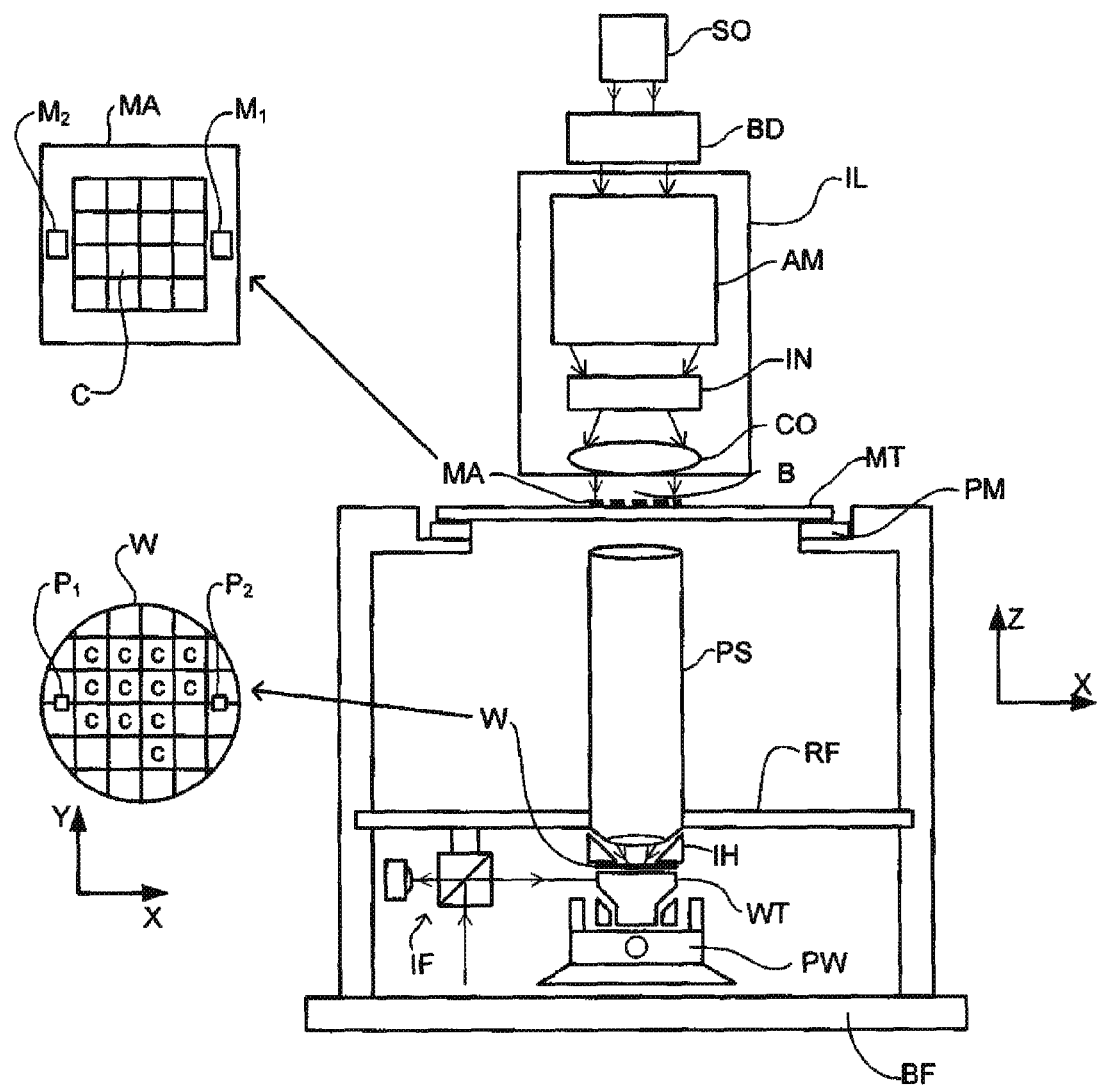
FIG. 1 depicts a lithographic apparatus according to an embodiment of the invention.
Figure 2:
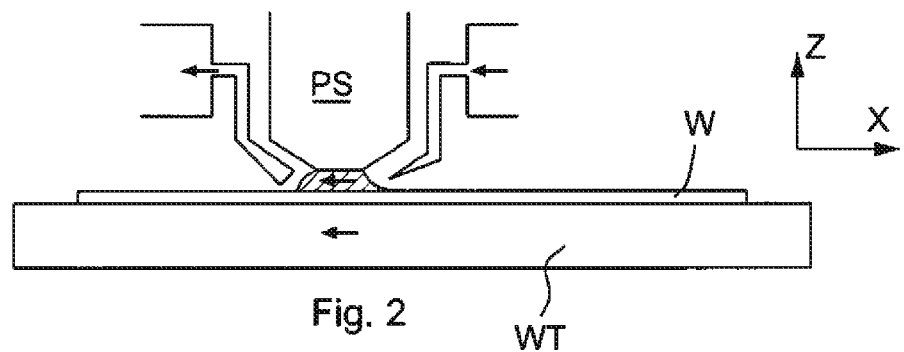
FIGS. 2 and 3 depict a fluid handling structure as a liquid supply system for use in a lithographic projection apparatus.
Figure 3:
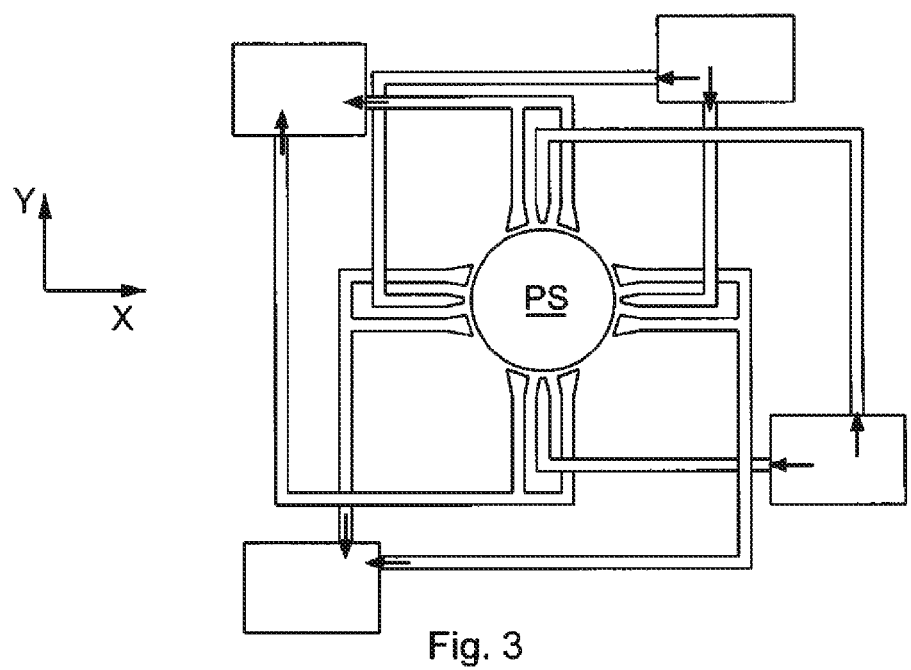
Figure 4:
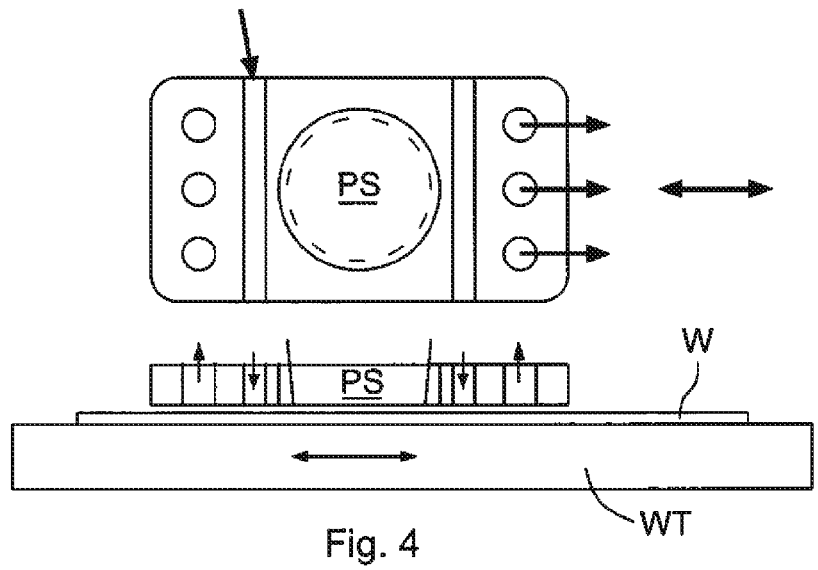
FIG. 4 depicts a further liquid supply system for use in a lithographic projection apparatus.

FIG. 1 schematically depicts a lithographic apparatus according to one embodiment of the invention. The apparatus comprises:
an illumination system (illuminator) IL configured to condition a radiation beam B (e.g. UV radiation or DUV radiation);
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS. The projection system focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement for providing liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

Another arrangement which has been proposed is to provide the liquid supply system with a liquid confinement member which extends along at least a part of a boundary of the space between the final element of the projection system and the substrate table. Such an arrangement is illustrated in FIG. 5.

Figure 5:
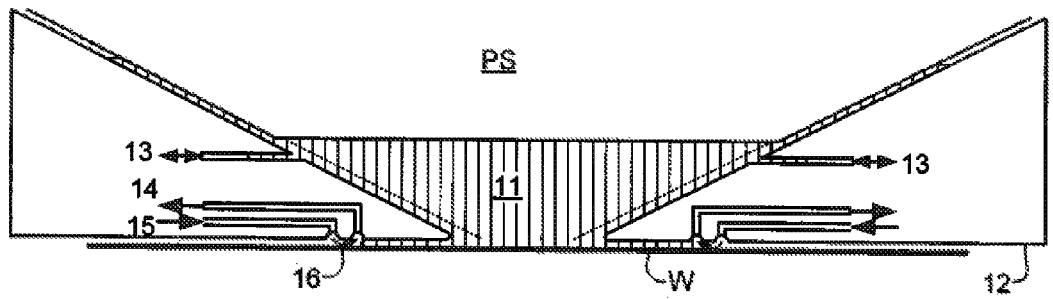
FIG. 5 depicts, in cross-section, a barrier member which may be used in an embodiment of the present invention as a liquid supply system.

FIG. 5 schematically depicts a localized liquid supply system with a barrier member 12. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the barrier member 12 positioned below and surrounding the final element of the projection system PS. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. The seal may be defined by a meniscus of liquid between the part of the liquid supply system and the substrate W. Relative movement between that part of the liquid supply system and the substrate W may lead to breakdown of the seal, for example the meniscus, and thereby leaking of liquid. The problem may be more significant at high scan velocities. An increased scan velocity is desirable because throughput increases.

Figure 6:
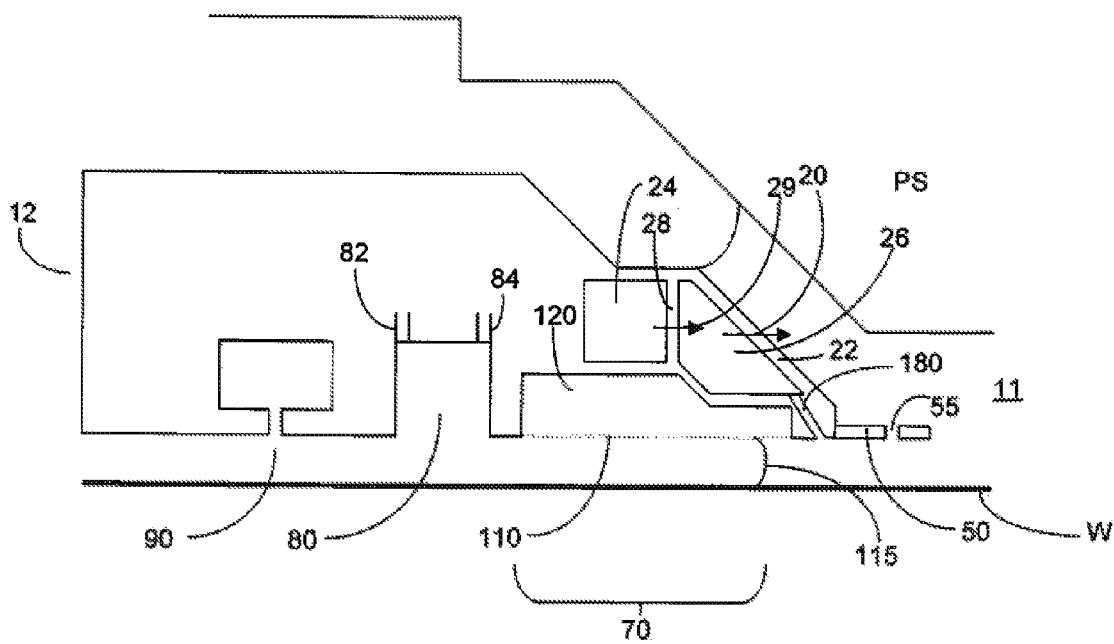
FIG. 6 depicts, in cross-section, a barrier member which may be used with an embodiment of the invention.

FIG. 6 illustrates a barrier member 12 which is part of a liquid supply system. The barrier member 12 extends around the periphery (e.g., circumference) of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier could also be other shapes so long as it has an opening through which the projection beam may pass out from the final element of the projection system PS. The opening may be centrally located. Thus, during exposure, the projection beam may pass through liquid contained in the opening of the barrier member and onto the substrate W. The barrier member 12 may be, for example, substantially rectangular and may not be necessarily the same shape as the final element of the projection system PS is at the height of the barrier member 12.

The function of the barrier member 12 is at least partly to maintain or confine liquid in the space between the projection system PS and the substrate W so that the projection beam may pass through the liquid. The top level of liquid is simply contained by the presence of the barrier member 12. The level of liquid in the space is maintained such that the liquid does not overflow over the top of the barrier member 12.

The immersion liquid is provided to the space 11 by the barrier member 12 (thus the barrier member may be considered to be a fluid handling structure). A passageway or flow path for immersion liquid passes through the barrier member 12. Part of the flow path is comprised by a chamber 26. The chamber 26 has two side walls 28, 22. Liquid passes from chamber 24 through the first side wall 28 into chamber 26 and then through the second side wall 22 into the space 11. A plurality of outlets 20 provides the liquid to the space 11. The liquid passes through through holes 29, 20 in side walls 28, 22 respectively prior to entering the space 11. The location of the through holes 20, 29 may be irregular.

A seal is provided between the bottom of the barrier member 12 and the substrate W (This feature indicates that the barrier member may be a fluid handling structure). In FIG. 6 a seal device is configured to provide a contactless seal and is made up of several components. Radially outwardly from the optical axis of the projection system PS, there is provided a (optional) flow plate 50 which extends into the space (though not into the path of the projection beam) which helps maintain substantially parallel flow of the immersion liquid out of outlet 20 across the space. The flow control plate has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an inlet 180. The inlet 180 can provide liquid in a direction towards the substrate. During imaging this may be useful in preventing bubble formation in the immersion liquid by filling a gap between the substrate W and substrate table WT with liquid.

Radially outwardly of the inlet 180 may be an extractor assembly 70 to extract liquid from between the barrier member 12 and the substrate W and/or the substrate table WT. The extractor 70 will be described in more detail below and forms part of the contactless seal which is created between the barrier member 12 and the substrate W. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. The inlet 82 may radially outwardly positioned with respect to the outlet 84. Radially outwardly of the recess 80 may be a gas knife 90. An arrangement of the extractor, recess and gas knife is disclosed in detail in United States patent application publication no. US 2006/0158627. However, in that document the arrangement of the extractor assembly is different.

The extractor assembly 70 comprises a liquid removal device or extractor or inlet such as the one disclosed in United States patent application publication no. US 2006-0038968, incorporated herein its entirety by reference. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 70. However, when the porous surface 110 comes into contact with liquid there is no meniscus to restrict flow and the liquid can flow freely into the chamber 120 of the liquid removal device 100. The porous surface 110 extends radially inwardly along the barrier member 12 (as well as around the space). The rate of extraction through the porous surface 110 varies according to how much of the porous material 110 is covered by liquid.

The porous material 110 has a large number of small holes each with a dimension, e.g. a width, such as a diameter, $d_{hole}$ in the range of 5 to 50 μm. The porous material may be maintained at a height in the range of 50 to 300 μm above a surface from which liquid is to be removed, e.g. the surface of a substrate W. In an embodiment, porous material 110 is at least slightly hydrophilic, i.e. having a contact angle of less than 90°, desirably less than 85° or desirably less than 80°, to the immersion liquid, e.g. water.

It may not always be possible to prevent gas being drawn into the liquid removal device but the porous material 110 will prevent large uneven flows that may cause vibration. Microsieves made by electroforming, photoetching and/or laser cutting can be used as the porous material 110. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

During scanning of the substrate W (during which the substrate moves under the barrier member 12 and projection system PS) the meniscus 115 extending between the substrate W and the barrier member 12 may be drawn either towards or away from the optical axis by a drag force applied by the moving substrate. This can lead to liquid loss which may result in: evaporation of the liquid, cooling of the substrate, and consequent shrinkage and overlay errors as described above. Liquid stains may also or alternatively be left behind from interaction between the liquid droplets and resist photochemistry.

Although not specifically illustrated in FIG. 6, the liquid supply system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery (e.g., circumference) of the barrier member 12 during movement of the barrier member 12 relative to the projection system PS. In an alternative or additional arrangement, liquid may be removed from the top of the barrier member 12 using, for example, an extractor such as a single phase extractor similar to the extractor 70. An alternative or additional feature is a liquidphobic or hydrophobic coating. The coating may form a band around the top of the barrier member 12 surrounding the opening and/or around the last optical element of the projection system PS. The coating may be radially outward of the optical axis of the projection system. The liquidphobic or hydrophobic coating helps keep the immersion liquid in the space.

In, for example, an apparatus in which a first substrate table WT1 and a second substrate table WT2 (or first and second stages) are provided in which each one carries a substrate W, there exists a difficulty during swap of one substrate table from underneath the projection system PS for another substrate table underneath the projection system PS. This is because if the liquid from the liquid handling or supply system IH is removed prior to swapping the tables WT1, WT2 then a drying stain may appear on the final element of the projection system PS.

Figure 9:
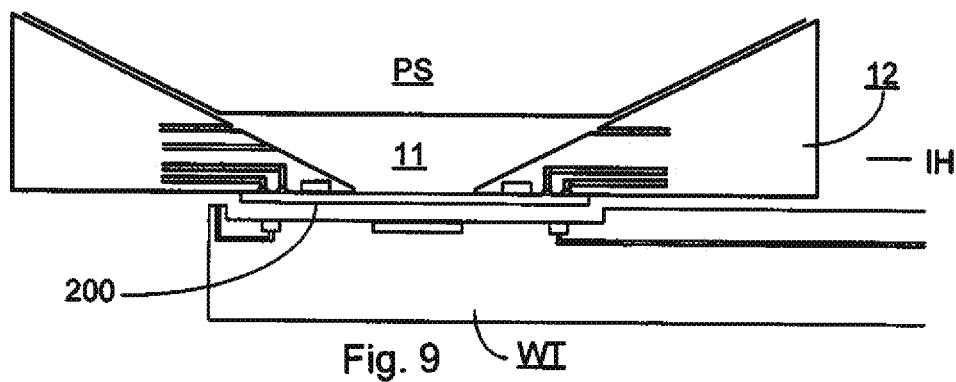
FIG. 9 depicts, in cross-section, a shutter member in the form of a closing disk during substrate and/or substrate table swap.

A possible solution to this problem which has been proposed is to provide a shutter member 200 or so called closing disk, such as a dummy substrate. The shutter member 200 can be positioned on the top surface of a substrate table as illustrated in FIG. 8. After scanning of the substrate W, the substrate table WT1 can be moved so that the shutter member 200 is positioned under the projection system PS. As illustrated in FIG. 9, the shutter member is positionable under the projection system PS during swapping of substrate tables. The shutter member 200 is attached to the bottom of the fluid handling or liquid confinement structure IH. In this way the fluid handling or liquid supply system can be kept full of liquid (e.g. on) during swap of substrates and no drying stains can form. Such a closing disk, e.g., a dummy substrate, is described, for example, in European patent application publication no. EP-1,420,299.

Figure 10:
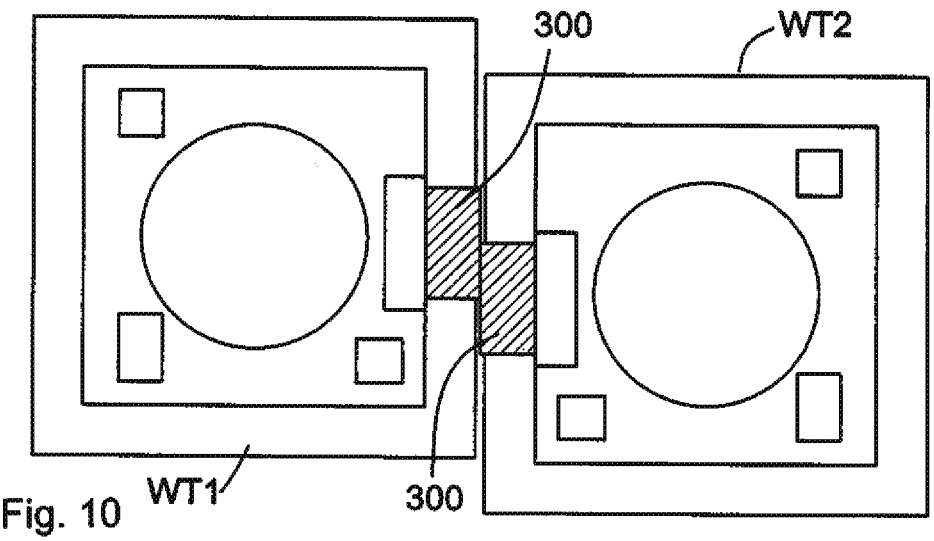
FIG. 10 depicts, in plan view, an embodiment of a shutter member in the form of a retractable bridge.
Figure 11:
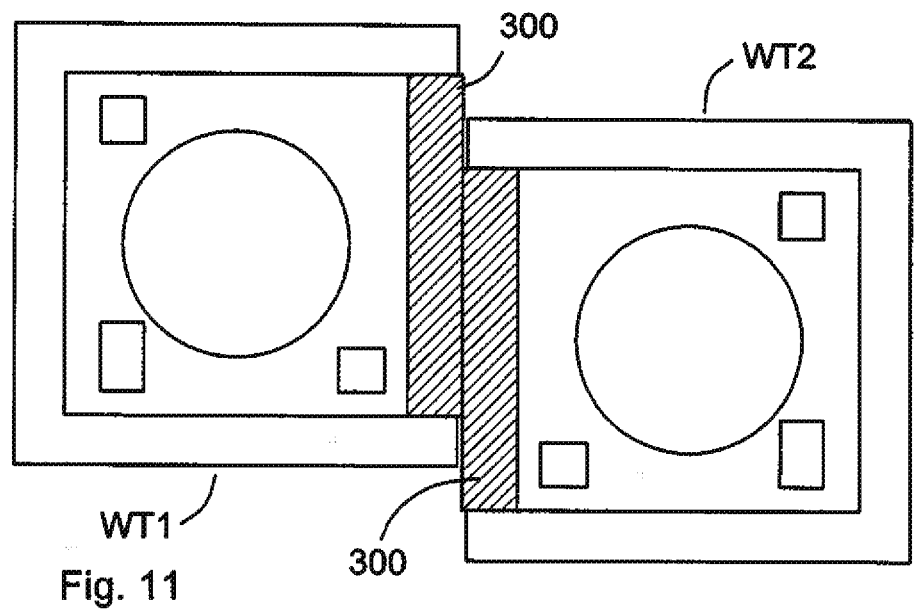
FIG. 11 depicts, in plan view, an embodiment of a shutter member in the form of a retractable bridge.

In another form of shutter member, the second substrate table WT2 is brought close to the first substrate table WT1. The two substrate tables are moved simultaneously under the projection system. If the gap between the two substrate tables is small (or at least has a drain underneath it) liquid loss should be minimal. In some instances (for example as illustrated in FIGS. 10 and 11) one or both substrate tables WT1, WT2 has its top surface extended by a protrusion 300 which may be rotatable or retractable, as in the form of a drawbridge. The protrusion may be fixed relative to the substrate table WT. Such an arrangement is disclosed in United States patent application publication no. US 2007-0216881. In a variation of this form of shutter member, the second table is not a second substrate table WT2, but its surface functions as a shutter member during substrate swap. Such a table may used for measuring and may be called a measuring table. The first or second substrate table is moved back under the projection system when a substrate is available, for example, for exposure. As will be appreciated, the shutter member may in addition or alternatively be used in a single substrate table apparatus in order to keep the projection system PS in contact with liquid during, for example, substrate swap on the substrate table.

A fluid extraction system 400 will now be described which, in one embodiment, is configured to remove liquid from a gap 401 next to a component of a retractable bridge 300. The fluid extraction system is also known as "swap bridge bubble extraction seal" (SWBBES). The system enables the leakage of immersion liquid between the substrate table WT and bridge 300 to below the bridge 300 and/or the substrate table WT to be reduced, desirably minimized or even substantially prevented. The fluid extraction system may reduce or even prevent the entrapment of bubbles by the immersion liquid in the reservoir of liquid confined by the liquid confinement structure.

Figure 12A:
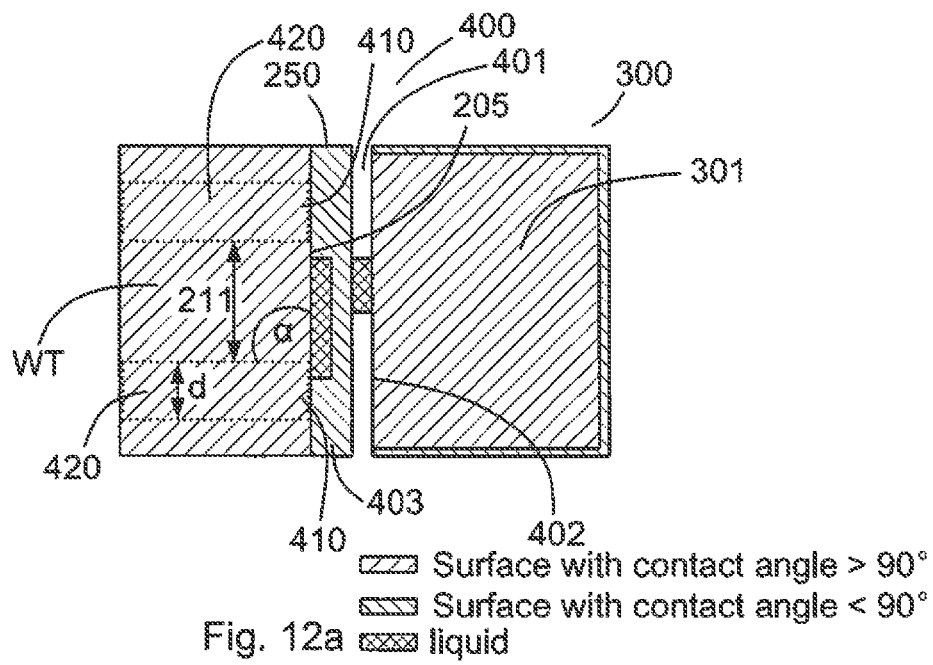
FIGS. 12a and 12b illustrate, in plan view and in cross-section, a fluid extraction system according to an embodiment of the invention.
Figure 12B:
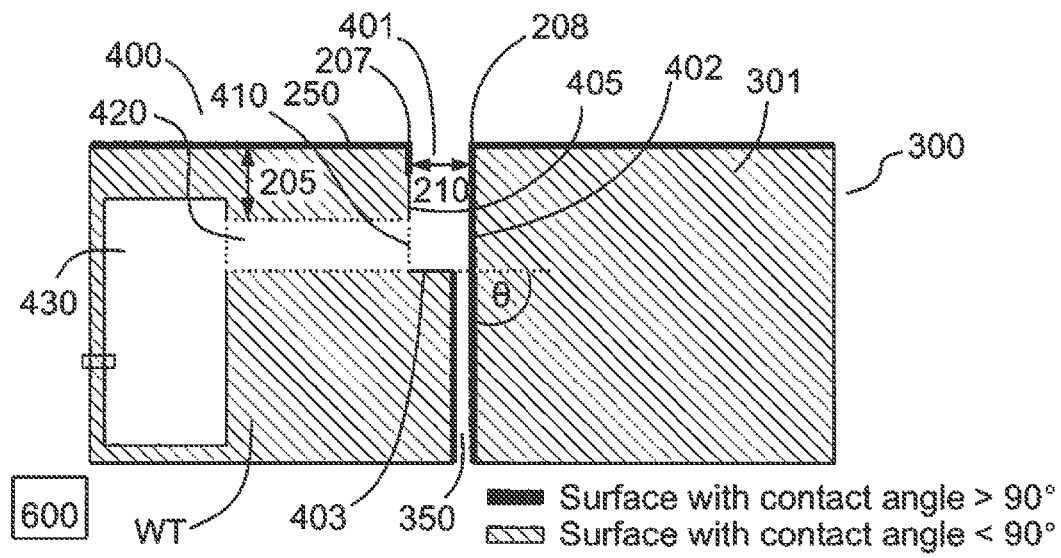

The fluid extraction system 400 is located, as shown in FIGS. 12a and 12b (together FIG. 12), on the side of the substrate table WT. The fluid extraction system may be provided in a bridge head 250 positioned between the substrate table WT and a retractable bridge body 301. The bridge head 250 is the edge of the substrate table which passes under the fluid handling system IH just prior to the retractable bridge body 301 passing under the fluid handling system IH. In an embodiment, the fluid extraction system 400 may be located in the retractable bridge 300.

The fluid extraction system 400 comprises a surface 405 with one or more discrete extraction openings 410, each for an extraction channel 420. The extraction openings 410 may be spaced equidistantly from one another, or not. It may be desirable to have non-equidistant spacing to account for different loads at different locations. In one embodiment, there may be a greater density of extraction openings 410 under the footprint of the fluid handling system (as opposed to outside the footprint). In another embodiment there may be a greater density of extraction openings 410 in positions corresponding to the outer width dimension (e.g., outer diameter) of the fluid handling system as the fluid extraction system 400 passes under it. The surface 405 with the discrete extraction openings 410 is provided along a length of the fluid extraction system 400. In an embodiment, the surface 405 is a vertical surface (i.e. a surface which is substantially perpendicular to the top surface of the substrate table WT). In another embodiment, surface 405 may be at an angle to the top surface of the substrate table WT, as described below with reference to FIGS. 14a and 14b. One embodiment may have the surface 405 at different angles at different locations. The surface 405 faces an edge surface 402 of the retractable bridge body 301 and a gap 401 is formed between those two surfaces 402, 405. The extraction openings 410 are thereby formed in a sidewall surface 405 of the substrate table WT. The extraction openings 410 could equally well be formed in a side wall surface 402 of the retractable bridge body 301. The positioning of extraction openings 410 in a sidewall surface 402, 405 (as opposed to a surface which is parallel to the top surface of the substrate table WT) is that less space is used. Furthermore, the volume of the gap 401 can be minimized for a given width (e.g., diameter) of opening 410. In one embodiment, the gap 401 desirably has a certain depth (for example distance between the top surface and a ledge 403 (described below)) to avoid interactions of the bottom of the gap 401 with fluid (particularly gas) from the fluid handling device. If the openings 410 were in the bottom of the gap 401, the gap will need to have a certain width so that the openings 410 could have a certain width (e.g., diameter). The width of the gap 401 can be made less if the openings 410 are in a sidewall. As a result, the volume of the gap 401 is kept small so that it can quickly be cleared of liquid, thereby reducing the chance of liquid finding its way beyond the openings 410 (for example entering slit 350 described below). In another embodiment the depth of the gap 401 is as small as possible (as small as can be machined) thereby to reduce as far as possible the amount of liquid in the gap 401. The sidewall surface 402, 405 need not be perpendicular to the top surface of the substrate table WT, as described below. The sidewall surface 405 of the substrate table WT may be at an angle to the top surface of the substrate table such that the surface 405 undercuts the substrate table WT. A suitable range of angles is 90° to 0°, desirably 90° to 30° or 90° to 50°. The length of the fluid extraction system 400 may substantially correspond to the width of the retractable bridge body 301.

A ledge 403 is formed below the extraction openings 410. In an embodiment, the ledge 403 comprises a horizontal surface which may be substantially parallel to the top surface of the substrate table WT. An angle between the surface 405 in which the openings 410 are formed and the ledge 403 is approximately 90°. As described below, the angle may be less than 90°. The ledge 403 can catch liquid which falls into the gap 401 and that liquid can then be extracted through openings 410. In an embodiment, the ledge 403 is angled relative to the top surface of the substrate table WT. Desirably, the ledge 403 may be angled downwards towards the openings 410. The angle of the ledge 403 away from the parallel to the top surface of the substrate table is less than 45 degrees or less than 30 degrees, desirably less than 10 degrees or even less than 5 degrees and greater than 0 degrees. In one embodiment, the angle may be as high as 90°. In that case, the ledge can be seen as a protrusion forming a ledge.

The extraction channels 420 and their respective openings 410 are configured and located to extract immersion liquid present in the gap 401 between two interfaces, for example between the bridge head 250 and the retractable bridge body 301, or between the substrate table WT and the retractable bridge body 301. The use of extraction channels 420 with a plurality of openings 410 may be less sensitive to contamination than a single extraction channel having a slit-shaped opening. The arrangement of the fluid extraction system 400 is designed to be robust.

In use the extraction channels 420 apply a known capillary pressure to extract the liquid. While operating, the extraction channels 420 extract a two phase fluid, comprising gas and immersion liquid. That is, as a whole, gas and immersion liquid are extracted through the fluid extraction system 400, though single phase gas or single phase liquid may be extracted through one or more extraction channels 420 at any one time. The extraction channels 420 have tuned (i.e. selected) dimensions, for example diameter and length. The dimensions are selected so that the capacity for two-phase flow over substantially the whole width of the retractable bridge body is the same, i.e. uniform.

The extraction channels 420 width (e.g., diameter) "d" is selected to optimize the spacing between the openings 410 of the extraction channels 420. As large a diameter as possible is desirable to avoid clogging by contamination. However, if the width is too large, the homogeneity of the extraction can decrease. If the width is too large, the size of the collector channel 430 (as described in more detail below) may need to be increased. In an embodiment, d is desirably between 0.1 and 1.5 mm, more desirably between 0.3 and 1.0 mm, desirably equal to or greater than about 0.3 mm. Thus, the risk of cluttering the channels may be minimized. The spacing 211 between adjacent extraction channels 420 is chosen, so immersion liquid is removed, desirably substantially completely, from the gap between the two interfaces. The spacing 211 may be dimensioned to be in the range of 0.1 to 2 mm, desirably 0.5 to 1.5 mm, or 1.2 mm or less than about 1.0 mm.

The extraction channels 420 direct the extracted fluid to a collector channel 430. The collector channel 430 is common to at least two extraction channels 420, desirably common to all extraction channels 420 of the fluid extraction system 400. The collector channel 430 is in the substrate table WT, particularly the bridge head 250. The homogeneous extraction, i.e. a pressure, over the whole length of the fluid extraction system, e.g. the width of the retractable bridge body, may be created by selecting the volume of the collector channel 430 to be large relative to the volume of the extraction channels 420. Mathematical relationships are provided towards the end of this description.

The relationship between the volume of the extraction channels 420 and the collector channel 430 may affect the speed of the gas flow through the extraction channels 420. The gas speed in the extraction channel 420 may be three times or more than the gas speed in the collector channel 430. In a manifold the pressure drop over the extraction channels 420 (i.e. the difference in absolute pressure in the gap 401 between the bridge head 250 and the retractable bridge body 301 and the pressure in the collector channel 430) should be dominant with respect to the pressure in the collector channel 430. In such an arrangement, the pressure in the collector channel 430 is more uniform. To achieve the relationship between the pressure drop over the extraction channels 420 and the pressure in the collector channel 430, the cross-sectional area of the collector channel 430 perpendicular to the fluid flow may be at least twice the total cross sectional area of the extraction channels 420.

The pressure drop over the extraction channels 420 may be determined by a dynamic pressure, i.e. the entrance and exit resistance. The length of the extraction channel 420 and viscosity of the fluid are proportional to the pressure drop. Because of the short length of the extraction channels 420, this parameter is not as important as the cross-sectional area of the extraction channels 420. The width d of the extraction channels 420 is strongly correlated with the cross section of the collector channel 430, for example because the pressure drop is inversely proportional to the square of the width d. The gas speed criteria may be important, for example because the pressure drop may be proportionate to the square of the gas speed. For example an increase in gas speed by a factor of three means there is a change by about factor of ten (specifically nine) in pressure. Note that the pressure in the collector channel 430 should be lower than the capillary pressure of liquid in the holes. (See formula at the end).

In an embodiment of the fluid extraction system, there may be limitation on the volume occupied by the system. The volume available may appear to be smaller than desired to achieve optimum working conditions. However, by angling ($0°<\alpha<90°$), or skewing, the extraction channels relative to the surface 405 in which the extraction openings 410 are present, the volume of the collector channel 430 relative to the extraction channels 420 may be increased. So, for example in such an embodiment compared to the embodiment in which the extraction channels 420 are perpendicular ($\alpha=90°$) to the inlet surface 405, for the same total volume of fluid extraction system 400 the following is true: (i) the volume of the collector channel 430 may be larger; and (ii) the length of the extraction channels 420 may be the same.

A larger collector channel 430 volume is desirable because the homogeneity of the extraction flow is improved. The angled extraction channels 420 may have an advantage over extraction channels 420 having a larger cross-sectional area (i.e. extraction openings 410 open to the gap) which are non-angled (i.e. perpendicular, $\alpha=90°$) of substantially the same dimensions. The pressure from each extraction channel opening 410 is thus applied over an increased effective area. So the area over which the under pressure from all the extraction channels 420 is applied is increased relative to extraction channels 420 perpendicular to the surface 405 of the fluid extraction system 400 in which the extraction openings 410 are defined. By angling each extraction channel 420, the effective length of the extraction channels 420 may also be increased. As the length of an extraction channel 420 has a linear relationship to the pressure drop applied over the extraction channel 420, an increase in length gives a larger pressure drop. By increasing the length, the uniformity of the applied pressure and the immersion liquid extraction flow may be improved. However, as mentioned elsewhere changes in the width provide a larger change in pressure drop.

The capillary pressure used by the extraction channels 420 may be dependent on the contact angle of immersion liquid to surfaces (surface 405 and surface of ledge 403) surrounding the extraction opening 410 of each extraction channel 420. Having the different surfaces of the fluid extraction system 400 with which immersion liquid contacts have different contact angles enables liquid to be controlled, such as in respect to its position. For example, the contact angle patterning may cause the immersion liquid to be confined in, i.e. 'stick to', certain surfaces of the fluid extraction system 400. By having such surfaces around the extraction openings 410, the extraction channel openings 410 may be spaced further apart, for example in the range of zero to five mm, or less than 5 mm.

The geometry shown in FIG. 12 is a possible embodiment of a fluid extraction system fitted between a bridge head 250 and a retractable bridge body 301. It indicates certain dimensions and a possible contact angle patterning.

The extraction flow of the immersion liquid is determined by: the distance between the bridge head 250 and the retractable bridge body 301 (e.g. the gap 401 width 210), the distance from the top surface of the substrate table WT to the top of the extraction openings 410 (the extraction channel displacement of surface 205) and geometry of the edges 207, 208 at the top surface of the bridge head 250 and retractable bridge body 301 at the gap 401. In an embodiment, the gap 401 is a space between the bridge head 250 and the retractable bridge body 301 which separates the two interfaces completely. Such a gap is a continuous gap as shown in FIG. 12. As can be seen from FIG. 12b, the width of the gap 401 is uniform. Above the ledge 403 the gap 401 has a certain dimension. Below the ledge 403, there is a slit 350 between the bridge head 250 and the retractable bridge body 301. The slit 350 below the ledge 403 is open to the atmosphere. That is, the gap 401 is open to a gas source under the extraction openings 410. As will be described below, this allows gas to be drawn through the slit 350 below the ledge 403, in use. In another embodiment, the slit 350 beneath the ledge 403 may be sealed. In the case that a slit 350 is present, there is a gas flow out of the slit 350 into the gap 401. This gas flow helps the extraction of the immersion liquid. The flow through the slit 350 may provide an upward force that loosens liquid which may be secured, or pinned on the outer edge of the ledge 403.

In FIG. 12, the outer edge of the ledge 403 may be at the top of the slit 350 which is lower than the gap 401. The slit 350 may be narrower than the gap 401. The flow rate and direction of the flow through the slit 350 may be selected by optimally dimensioning the length and the width of the slit 350 as well as its angle $\theta$ relative to the top surface of the retractable bridge body 301. The flow rate and direction of flow through the slit 350 may be selected by optimally dimensioning the distance between the top surface of the substrate table WT and the top of extraction openings 410 and/or how far the ledge 403 protrudes from the surface 205 in which the extraction openings 410 are positioned. The angle $\theta$ may be between 10 and 30 degrees, for example 20 degrees. That is the angular displacement between the longitudinal dimension of the extraction channel and the plane of surface in which an extraction channel is defined is substantially 20 degrees. The gas flow may prevent droplets of immersion liquid from remaining, i.e. sticking, in the slit 350. In an embodiment, the slit 350 is optional and is not essential to the operation of the invention. It is present because the retractable bridge body 301 is configured to avoid direct contact with the substrate table WT.

Figure 13A:
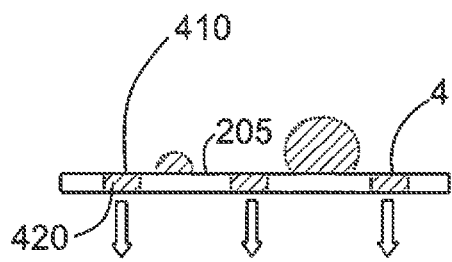
FIGS. 13a and 13b illustrates, schematically, a coating around fluid extraction openings in an embodiment of the invention.
Figure 13B:
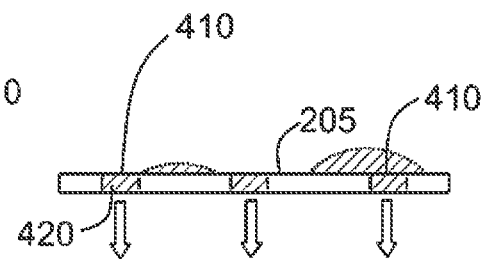

In an embodiment, all surfaces of the gap 401 and/or slit 350 are coated with a lyophobic, desirably a hydrophobic, coating (i.e. a surface which is hydrophobic to immersion liquid such as water). In an embodiment, the surface of the ledge 403 and the surface 205 in which the extraction openings are formed that are used to hold or confine the liquid in the region around the extraction channel openings 410 are liquidphilic desirably hydrophilic (i.e. are liquidphilic to the immersion liquid). Here a liquidphilic surface has a contact angle less than 90 degrees, practically 50 degrees or more and, desirably more than 60 degrees and/or less than 70 degrees. The surfaces adjacent to the liquidphilic surfaces 403, 205, i.e. away from the openings are lyophobic. Such surfaces include the surfaces of the slit 350, the top surface of each of the bridge head 250 and the retractable bridge body 301 and the other surfaces of the gap 401. The liquidphilic surfaces may help the extraction of smaller volume droplets. A droplet bearing surface which is liquidphilic has a larger surface area of contact with which a droplet of a certain size (i.e. volume) than a less liquidphilic or a liquidphobic surface, as shown in FIGS. 13a and 13b. Note that FIG. 13a shows a surface in which are formed openings 410. The surface 205 is liquidphobic and bears a droplet of liquid. FIG. 13b shows the same arrangement as FIG. 13a, except the surface 205 is less liquidphobic than that in FIG. 13b (e.g., liquidphilic). The arrangement in FIG. 13b may achieve better removal of liquid through its openings 410 than the arrangement in FIG. 13a through its openings 410. In an embodiment of the arrangement shown in FIG. 13a, a droplet on the surface 205 is not extracted, but a similar droplet on the surface 205 of the arrangement shown in FIG. 13b is extracted through its openings 410.

The bridge head 250 may be replaceably attached to the substrate table WT. This allows easy maintenance, particularly for cleaning and/or renewing any coatings.

An embodiment of the present invention may prevent the formation of bubbles in the immersion liquid within the fluid handling system or liquid confinement structure IH. As the gap crosses under the fluid handling system or liquid confinement structure IH, the under pressure generated by the fluid extraction system 400 pulls the meniscus of the immersion liquid within the fluid handling system or liquid confinement structure IH towards the gap 401. The meniscus is pinned to the outer edge 207 of the bridge head 250 and the inner edge 208 of the retractable bridge body 301 (with respect to the gap 401) of the gap 401 as the gap 401 crosses under the meniscus. The meniscus is thus stretched as the gap 401 crosses the meniscus. The pulling by the under pressure thereby reduces the stretching of the meniscus. Entrapment of gas by the liquid layer under the fluid handling system or liquid extraction system may therefore be reduced.

The shape of the outer edge 207 of the bridge head 250 and the inner edge 208 of the retractable bridge body 301 (with respect to the gap 401) of the gap 401 influences the pinning of the meniscus. An edge with at least a certain radius of curvature will reduce the pinning. This is described herein with reference to FIGS. 19a and 19b. An edge with a radius of curvature may reduce the stretching of the meniscus. As the gap crosses the fluid handling system or liquid confinement structure IH, the meniscus will encounter the edges in succession. As a rounded edge reduces pinning, it is desirable that the first edge encountered by the meniscus is rounded. The second edge may be sharper, with a small radius of curvature, to enable the meniscus to be pinned. This arrangement may reduce the stretching of the meniscus, by enabling the meniscus to close the gap quickly as, for example, the top surface of the retractable bridge body 301 moves under the fluid handling system or liquid confinement structure. As mentioned above, in an embodiment the gap 401 may be between the retractable bridge body 301 and the bridge head 250. In an embodiment the gap 401 may be between the substrate table WT and a temporary extension between substrate tables, such as the retractable bridge 300.

An embodiment in which the fluid extraction system 400 only ever passes beneath the projection system in one direction is described below with reference to FIGS. 18a and 18b. This is desirable because the fluid extraction system 400 can be optimized for travel in this direction and/or any coatings will not wear out as fast (because of less traffic over them).

The arrangement may encourage the meniscus of the space 11 in the fluid handling system or liquid confinement structure IH to roll over the gap 401, without loss of immersion liquid. This may be achieved by selecting the width of the gap 401 at the top and the advancing contact angle of the immersion liquid relative to the surface (i.e. coating) on the underlying top surfaces. The underlying top surfaces may be the substrate table WT and the retractable bridge body 301. The selected contact angle may be indicative of a hydrophobic surface and may be, for example, greater than about 95 degrees.

Described here are possible shapes, configurations, specifications and limitations which may enable the fluid extraction system 400 to work in the gap 401. These configurations are designed to reduce, if not substantially minimize, the heat loss and cooling effect through operation of the fluid extraction system 400. The configurations may reduce the evaporation of the liquid. The flow of fluid, including immersion liquid, through the fluid extraction system 400, for example the extraction channels 420, may be minimized. Desirably, the flow should be less than about 100 l/min, desirably less than about 20 l/min. The range of desirable flow rates may influence the width range of the top of the gap 401. Selection of a gap dimension may determine the achievable flow rate. The flow rate is dependent on, for example, the number of extraction channel openings 410 and dimensions of the fluid extraction system 400.

The width of the top of the gap 401 is between about 0.0 mm to about 1.0 mm. The gap width is desirably in the range of about 0 mm to about 0.5 mm, desirably about 0.3 mm. To help assure that there is no liquid leakage, the slit 350 has a width range of about 0 mm to about 0.5 mm, desirably about 0.1 mm. In one embodiment the slit 350 has the same width as the gap 401, for example about 0.1 mm. In such an embodiment according to FIG. 12, the dimension of the ledge 403 may be zero or substantially zero (i.e. the ledge 403 is not there). The fluid flow through the extraction openings 410 may substantially the sum of the flow through the gap 401 defined between the bridge head 250 and the inner edge of the retractable bridge body 301 and through the slit 350. In an embodiment the flow rate through the slit 350 is substantially three times lower than the flow through the upper end of the gap 401.

In an embodiment, the ledge 403 is located under the surface 205 in which the extraction openings 410 are formed. That is, the surface 205 is angled so that the gap 401 gets wider as one enters the gap 401 from the top surface of the substrate table WT. That is, the surface 205 forms an angled overhang. Where the gap 401 width at the top and the width of the slit 350 are substantially the same, the size of the ledge 403 may be more than substantially zero.

Where surfaces 205 and 403 are hydrophilic, the extraction channels 420 may extract substantially all the liquid which enters the gap.

The outer edge 207 of the bridge head 250 and the inner edge 208 of the retractable bridge body 301 (with respect to the gap 401) of the gap 401 (i.e. the upper edges 207, 208 of the gap 401) can be rounded with a radius of about 0 mm to about 1 mm. The edges may be chamfered. Use of one of these features this will reduce the pinning behavior of the meniscus as described previously.

The extraction channel openings 410 may be about 1 mm below the top surface of the retractable bridge body 301 (i.e. the depth of the extraction channel openings 410 is about 1 mm). The depth of the extraction channel relative to the top surface of the retractable bridge body 301 enables the fluid extraction system to remove substantially all of the immersion liquid that escapes into the gap in a small amount of time. This arrangement reduces, desirably substantially minimizes, the volume of the upper part of the gap 401 (i.e. the gap 401 less the slit 350). If the volume of the upper part of the gap 401 is larger than a threshold size (for certain parameters such as flow rate) it would take a long time to remove immersion liquid from the gap 401. Immersion liquid may then escape through the slit 350 and may, for example, escape back out of the gap 401 onto the top surface.

Figure 14A:
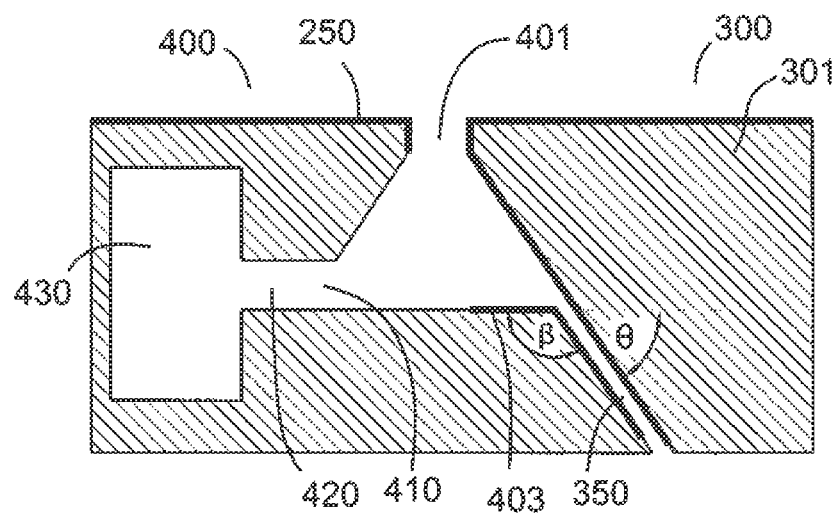
FIGS. 14a and 14b each illustrate, in cross-section, a fluid extraction system according to an embodiment of the invention.

As mentioned previously, the slit 350 may be angled with respect to the gap 401 opening and the extraction channels 420, which may be horizontal or parallel with respect to the top surface of the retractable bridge body 301. FIG. 14a shows a horizontal extraction channel 420 setup. The extraction channels 420 may be placed horizontally. The position of the slit 350 may be angled by altering angles β and θ. FIG. 14a also shows surface 405 at an angle to the top surface of the substrate table WT of about 60°. The angle may be between 30 to 90°.

Figure 14B:
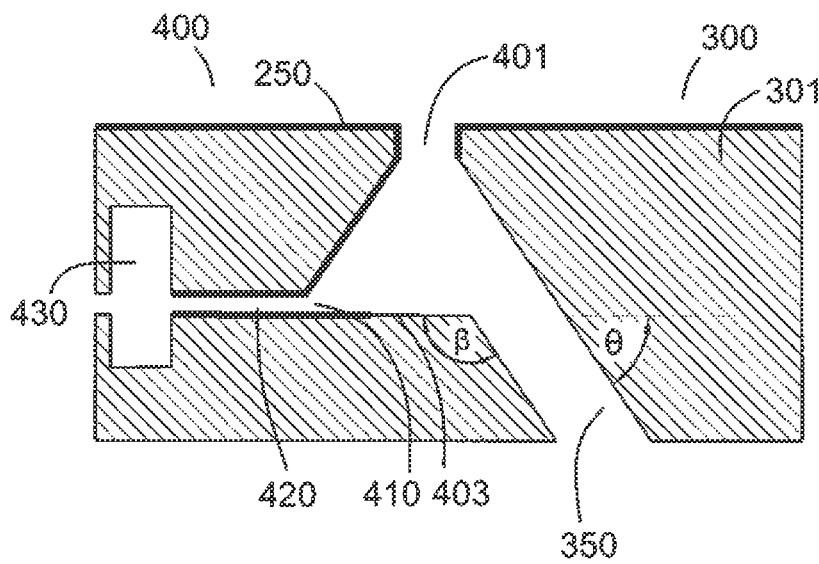

An arrangement with a generally non-vertical gap 410 and/or slit 350 geometry is shown in FIG. 14b. In an embodiment the extraction channel 420 may be angled with respect to the surface of the bridge head 250. An embodiment thus may have a geometry in which the extraction channel 420 is not perpendicular to the slit 350, i.e. they are acutely or obtusely angled with respect to each other. The angle of the extraction channel 420 may be altered with respect to the slit 350 by altering angles β and θ. Angle β may range between 0 and 180° desirably 70-125° and angle θ may range between 0 and 180° desirably 70-125°. Generally a sum of β and θ is equal to about 180°.

The gap and fluid extractor geometry may be used at any interface in the plane of the substrate table top surface. For example, the sensor edge, substrate edge, measuring table edge and substrate table edge are all suitable locations. Note that locations for which fluid extractor systems have previously been described in which the opening is a slit, it is recognized that new features include: the system geometry, coating locations and the use of discrete extraction channels rather than a single slit.

Figure 15:
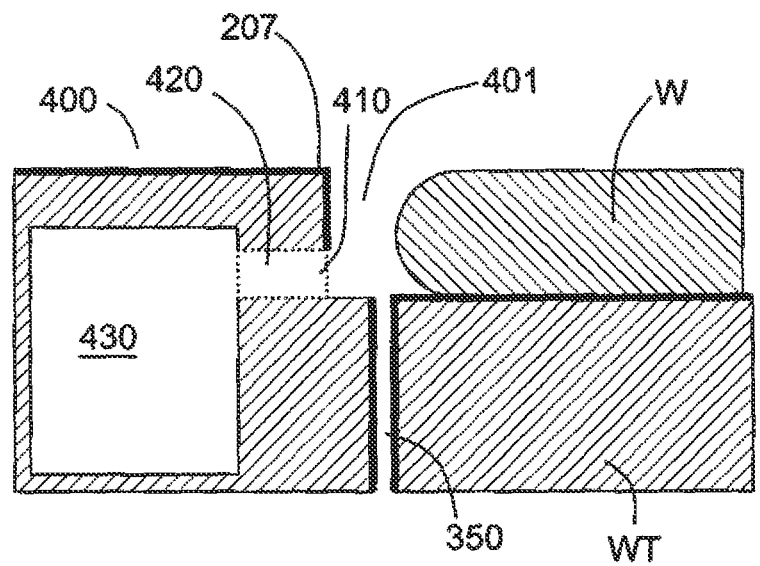
FIG. 15 illustrates, in cross-section, a fluid extraction system according to an aspect of an embodiment of the invention and implemented at the edge of a substrate.

For an example of an implementation in a substrate table, at the substrate W edge, see FIG. 15. For a substrate edge fluid extractor system the new features may include, but are not limited to the following. A coating may be present on the surface of the extraction channels 420, beyond the extraction channel opening 410. A coating may be present on the substrate table WT surface beneath the substrate W, (i.e. the substrate support). The edge of the recess in which the substrate W is placed may be rounded, with a radius of curvature of for example less than about 0.5 mm, desirably about 0.1 mm to about 0.2 mm, but not 0 mm. The surface 205 in which the extraction channel openings 410 are formed may be sloped, so that it is in the shape of, for example, a truncated cone with the part of the cone which has the lowest diameter being at the top. The coating of the substrate, for example at the edge of the substrate near the gap, may be liquidphobic or liquidphilic. A liquidphobic surface may enable a faster relative motion between the projection system and the substrate, i.e. faster scan speed. A liquidphilic surface may provide a better bubble performance that is a surface which may enable the risk of bubble inclusions within the immersion liquid to be reduced.

The fluid extraction system, with the described geometry and/or contact angle patterning may be implemented to a gap 401 between the interface of two tables, for example two substrate tables or a substrate table and measurement table. The fluid extraction system may prevent immersion liquid from escaping a reservoir of immersion liquid confined in a fluid or liquid handling structure as a gap crosses under it, or bubbles from being included in the reservoir from the gap, or both. The fluid extraction system may be implemented in the facing edge sides of the two tables. The fluid extraction system may be present in an edge of each table so that when the tables are brought together, there is a fluid extraction system in at least one of the edges, desirably underneath the path of the liquid confinement structure. FIG. 16 illustrates an embodiment in which a fluid extraction system is positioned on adjacent substrate tables WT. In an alternative embodiment a fluid extraction system may only be positioned on one of the substrate tables WT. In another embodiment one of the substrate tables WT may be replaced by a measurement stage or table. A measurement stage or table may be configured so that it is not capable of supporting a substrate, but may comprise for example, sensors, measurement tools, a cleaning station and cleaning tools. Particularly in such an embodiment, the plurality of discrete extraction openings 410 and extraction channels 420 may be replaced by a single slit.

The arrangement of the gap 401, extraction openings 410, extraction channels 420 and slit 420 in each table WT1, WT2 may be arranged as in any of the embodiments described above. An embodiment is shown in FIG. 16. The extraction channel openings are positioned in a recess in the side of the substrate table WT. A ledge 403 is present like in the embodiment of FIG. 12. The only difference is that a projection 506 is present at the outer edge of each ledge 403 though these projections 506 may not be present. The edge of the substrate table WT above the extraction channel openings 410 has a complicated shape. From the top, the surface of the edge is vertical. In a central portion the edge slopes inwards, towards the extraction openings 410 in a downward direction. In a final portion the surface is again vertical.

Note variations of the fluid extraction system for the gap between the retractable bridge and the substrate table may be applied to each of these other arrangements.

Figure 17:
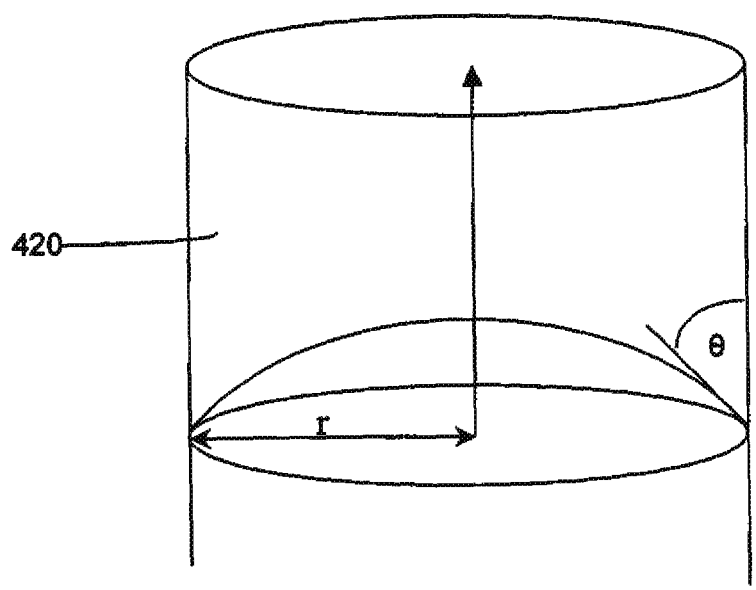
FIG. 17 illustrates, schematically, the behavior of liquid in an extraction channel.

To extract the immersion liquid through the extraction channels a certain pressure drop over these extraction channels 420 should desirably exist. The pressure drop should desirably overcome the resistance derived from immersion liquid and extraction channel wall interactions, as shown in FIG. 17. The minimal gas speed v is a function of the length l of the extraction channels 420, the contact angle θ in FIG. 17 of immersion liquid with walls of the extraction channel 420, surface tension σ of the fluid, viscosity of gas μ and the diameter D (or two times radius r in FIG. 17) of the extraction channel 420. The relationship between these parameters is shown in the following equations:

$$\Delta P_{cap} = \frac{4 \cdot \sigma \cdot \cos\theta}{D},$$

this determines the so called "bubble point"

$\Delta P_{ext} > \Delta P_{cap}$, condition to avoid capillary clogging $$\Delta P_{ext} = \frac{32 \cdot l \cdot v \cdot \mu}{D^2} + \varsigma \frac{1}{2}\rho v^2,$$

this determines the extraction flow $\Delta P_{ext} > 5\Delta P_{collector}$, condition for uniform extraction through the holes The extraction system should desirably be laid out such that there is a guaranteed flow through all extraction channels, despite the influence of capillary effects.

If a hole is filled with liquid, it can not be emptied if the pressure drop over it is less than a 'bubble point'. The 'bubble point' is the pressure needed to pull the liquid through the hole against the capillary pressure. This is relationship is shown in the first formula above.

To avoid the blocking of an extraction channel, the pressure drop over all channels should desirably be larger than the capillary pressure as defined by the second formula above. That is, the pressure drop over all of the extraction channels 420 defined by $\Delta P_{ext}$ should desirably be greater than the capillary pressure generated by fluid being present in an extraction channel 420. If this is the case, any fluid in an extraction channel 420 will be extracted into the collector channel 430 thereby ensuring that none of the extraction channels 420 will become permanently blocked with liquid. Because all extraction channels 420 are connected to the same extraction duct, i.e. the collector channel 430, they all experience substantially the same pressure drop. Undesirably all the extraction channels but one contain gas and are not filled with liquid. Thus, the flow resistance for the gas is very low. There is then the risk of the pressure drop in the extraction channels dropping below the "bubble point". In such a case, the extraction channels containing liquid are not emptied. Liquid remains in each filled channel.

To help to ensure the bubble point pressure is reached, the gas flow through the extraction channels should be sufficiently large so that the pressure drop is larger than the required pressure. This is shown in the third formula above.

The fourth formula above represents the relationship to ensure the width of the collector channel 420 is sufficiently large to create uniform conditions for all extraction channels 420. That is, this formula ensures that the pressure drop over the extraction channels 420 is greater than the pressure drop along the length of the collector channel 430. In other words, that the pressure drop over all of the extraction channels 420 is greater than the capillary force for each extraction channel 420, regardless of its position relative to an outlet or outlets from the collector channel 430. A controller 600 is provided to ensure that the flow out of the collector channel 430 is high enough to meet the above conditions.

As described above, it is advantageous that the gap 401 should only pass under the fluid handling system in one direction. For the case where the gap 401 is a gap between a substrate table and a swap bridge such a system is illustrated schematically in FIGS. 18a and 18b. The same principles could be applied to: the swapping of one substrate table WT1 for another substrate table WT2 under the fluid handling system without a swap bridge; or the swapping of a first substrate table WT1 for a measurement stage followed by swapping of that with a second substrate table WT2 under the fluid handling system.

FIG. 18a illustrates a first situation in which a first substrate table WT1 is positioned under the fluid handling system or liquid confinement structure IH. A first swap bridge 301a is positioned on the left hand side of substrate table WT1. The first swap bridge 301a may either be associated with the left hand side of the first substrate table WT1 or the right hand side of the second substrate WT2. The second substrate table WT2 is positioned to the left of the first swap bridge 301a and the first substrate table WT1 is positioned to the right of the swap bridge 301a. The first and second substrate tables WT1 and WT2 and the swap bridge 301a move rightwards as illustrated by arrow 701 so that the second substrate table WT2 moves under the fluid handling system or liquid confinement system IH. A fluid extraction system 400 as hereinbefore described, may be present in either or both gaps on both sides of the first swap bridge 301a.

The first substrate table WT1 can then travel using any path 740 and passing any service 750 (e.g. substrate control, load, measurement etc) prior to moving to the left hand side of the second substrate table WT2.

In order for the substrate table WT2 to be swapped from under the fluid handling system or liquid confinement structure IH and be replaced by the first substrate table WT1, the first substrate table WT1 is provided to the left of the substrate table WT2 which is under the fluid handling system or liquid confinement structure IH as illustrated in FIG. 18b. A second swap bridge 301b which may be different to the first swap bridge 301a is then provided. The second swap bridge 301b may be attached to the left hand side of the second substrate table WT2 or to the right hand side of the first substrate table WT1. This is the opposite side to which the swap bridge 301a in FIG. 18a is attached. The first substrate table and second substrate table WT1, WT2 and the second swap bridge 301b then move to the right so that the first substrate table WT1 is positioned under the fluid handling structure or liquid confinement structure IH. In this way each of the gaps between the substrate tables WT1, WT2 and the swap bridges 301a, 301b are only traversed in one direction. This allows the design of the fluid extraction device 400 to be optimized for movement in that particular direction.

A similar scheme may be used for swapping different types/combinations of table (e.g. a measurement table) under the fluid handling system.

A motion controller 700 is provided for controlling movement of the substrate tables WT1, WT2, measurement table, etc. under the projection system PS.

FIGS. 19a and 19b illustrate the difference in behavior of a meniscus as it passes over a sharp edge and a curved edge. FIG. 19a shows the behavior of a meniscus moving over a sharp edge, which is shown as height step 1000 in a surface and may have a protrusion 1010 as shown. In the first illustration of FIG. 19a, a liquid confinement structure 12 is shown located above the height step 1000. The liquid confinement structure 12 has an opening 1020 through which liquid is supplied towards the surface with the height step 1000 (which hereafter is referred to as a facing surface). Liquid is removed in a two phase flow through an extraction opening 1030. A meniscus 1040 is pinned at the extraction opening 1030. The other end of the meniscus 1040 is located on the facing surface. The relative motion between the liquid confinement structure and the facing surface (e.g., the liquid confinement structure is moving, or the facing surface is moving, or both) is such that the meniscus 1040 (and the immersion liquid in the space 11) is moving leftwards in FIG. 19a, towards the height step 1000, as shown by arrow 1050.

When the end of the meniscus 1040 which is moving over the facing surface reaches the protrusion 1010 it is pinned by the protrusion 1010. This is shown in the second illustration in FIG. 19a. So as the relative movement continues to cause essentially meniscus 1040 to move leftwards away from the protrusion, the meniscus 1040 extends and stretches. This is shown in the third illustration in FIG. 19a. As the meniscus extends it becomes weaker and may become unstable. The meniscus may break, for example, at a point intermediate the two ends of the meniscus contacting the facing surface, as shown in the fourth illustration in FIG. 19a. This could entrap a bubble 1055 in the immersion liquid. Such a bubble may move in the immersion liquid into the space 11 and interfere with an exposure causing an increase in defectivity.

This description may apply to an advancing meniscus, as there is relative movement between a confinement structure and a facing surface of a table or a substrate W. A similar mechanism may occur in a trailing meniscus where meniscus instability may cause immersion liquid to escape from the space 11 for example as droplets. The droplets may be a further source of defectivity for example by applying a thermal load on evaporating, leaving a drying stain after evaporating and/or providing a risk of bubble inclusion in the immersion space 11 on re-contacting the meniscus 1040.

The features of FIG. 19b are the same as that of FIG. 19a, except the height step 1000 has a curved edge 1060, for example with at least a certain radius of curvature. The edge may smooth. An edge with a radius of curvature may reduce the stretching of the meniscus. Therefore as the meniscus 1040 moves over the height step 1000 with a curved edge 1060, it has greater stability than the meniscus shown in FIG. 19a. A system with such a height step may be less likely to cause bubble inclusions in an advancing meniscus and less likely to cause droplet formation from a trailing meniscus.

The description of FIGS. 19a and 19b refers to a height step. The height step may be a surface discontinuity, for example the edge 207 of a surface at a gap as shown in FIGS. 12a, 12b, 14a, 14b, 15 and 16.

The height step 1000 may be, or an edge of, a removable component 1070, which may be adhered to a surface, such as a sticker. A removable component 1070 may be used to cover a gap or provide a surface with a stable, persistent contact angle for example as a liquidphobic surface. Such a removable component may have a thickness providing a height which is less than 100 micrometers, desirably selected from the range of 10 to 50 micrometers, for example 15 to 30 micrometers, desirably less than 20 micrometers. Reducing the height (i.e. thickness) of the removable component may reduce bubble inclusion and droplet loss.

On a facing surface there may be different features that effectively provide height steps, such as between the substrate and the substrate table, between the surface of a shutter member and the substrate table, between a removable component or a sensor on the table and substrate table. It is desirable that the distance between such discontinuities or height steps is optimized, desirably maximized, so as to reduce or minimize the frequency with which the stability of the meniscus may be affected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

In an embodiment, there is provided an immersion lithographic apparatus, comprising: a substrate table, a shutter member, a fluid handling structure and a fluid extraction system. The substrate table is configured to support a substrate. The shutter member has a top surface, wherein, in use, the top surface is substantially co-planar with a surface of the substrate table and the surfaces of the shutter member and the substrate table are spaced apart by a gap. The fluid handling structure is configured to supply and confine liquid between a projection system and (i) the substrate, or (ii) the substrate table, or (iii) a surface of the shutter member, or (iv) any combination selected from (i)-(iii). The fluid extraction system is configured to remove liquid from the gap through an extraction opening in a side wall surface of the shutter member and/or of the substrate table.

The shutter member may be a second table. The second table may be a second substrate table. The second table may be a measuring table. The shutter member may be a bridge between the substrate table and a second table. The bridge may be a retractable bridge.

The fluid extraction system may comprise a plurality of extraction openings, each opening being defined in the sidewall surface. The sidewall surface of the gap surrounding the openings may be lyophilic. At least part of a surface of the gap may be lyophobic. In an embodiment, substantially all the surface of the gap may be lyophobic.

Each extraction opening may be an aperture of an extraction channel. Each extraction channel may be connected to a collector channel, the collector channel being common to at least two extraction channels, desirably all the extraction channels. The collector channel may be in the substrate table or shutter member in which the extraction opening is formed. The volume of the collector channel may be substantially larger than the combined volume of the extraction channels.

The apparatus may further comprise a controller configured to control a flow rate out of the collector channel such that the pressure drop over each of the extraction channels is greater than a capillary pressure generated by fluid being present in an extraction channel. The controller may be configured to control the flow rate out of the collector channel such that the pressure drop over each of the extraction channels is at least 5 times greater than the pressure drop over the collector channel.

The radius of an upper edge of the gap may be less than 0.5 mm, desirably between 0.1 mm and 0.3 mm, and greater than 0 mm.

The apparatus may comprise a controller configured to control movement of objects in the apparatus such that the gap moves under the fluid handling structure in only a first direction. The gap may be open to a gas source from under the extraction opening. The apparatus may comprise a ledge in the gap, the ledge defining a surface substantially parallel with a top surface of the substrate table and below the extraction opening. The ledge may protrude from the sidewall surface by between 0.5 mm and 0 mm, desirably between about 0.15 mm and 0.05 mm. A bottom of the extraction opening may co-planar with the ledge.

The apparatus may comprise a plurality of extraction openings arranged in the gap in a pattern along the edge of the substrate table, or the shutter member, or both. In the pattern the extraction openings may be spaced equidistantly apart.

The gap beyond the opening may be a slit and the slit is angled with respect to the opening. The slit may be at an angle of between 0 and 180°, desirably 70-125° to the top surface of the substrate table.

In an embodiment, there is provided an immersion lithographic apparatus, comprising: a substrate table, a fluid handling structure, and a fluid extraction system. The substrate table may be configured to support a substrate. The fluid handling structure may be configured to supply and confine liquid between a projection system configured to direct a patterned beam of radiation at a target portion of the substrate, and the substrate, or the substrate table, or both. The fluid extraction system may be configured to remove liquid from a gap between the substrate and the substrate table, and may comprise a plurality of extraction openings to extract liquid, the openings being defined in a surface of the gap.

The surface of the gap surrounding the openings may be lyophilic. At least part of the surface of the gap may be lyophobic. Each opening may be an aperture of an extraction channel. Each extraction channel may be connected to a collector channel, the collector channel being common to at least two extraction channels, desirably all the extraction channels. The volume of the collector channel may be substantially larger than the combined volume of the extraction channels. The openings may be arranged in the gap in a pattern along the edge of the substrate table, or the shutter member, or both. The gap beyond the openings may be a slit and the slit may be angled with respect to the openings.

In an embodiment, there is provided an immersion lithographic apparatus comprising: a substrate table, a fluid handling structure and a fluid extraction system. The substrate table is configured to support a substrate. The fluid handling structure is configured to supply and confine liquid between a projection system configured to direct a patterned beam of radiation at a target portion on the substrate, and an underlying substantially planar surface, the underlying surface comprising two parts having a gap defined therebetween. The fluid extraction system is constructed and arranged to remove liquid from the gap, and comprises a plurality of openings arranged in a pattern.

The pattern may be a linear arrangement. The pattern may be repeating. The openings may be mutually equidistant. The two parts of the underlying surface may be defined by a substrate table and a substrate respectively. The two parts of the underlying surface may be defined by a substrate table and a shutter member respectively. The plurality of openings may be in a side wall surface of one of the two parts.

In an embodiment, there is provided a device manufacturing method comprising using a fluid handling structure to supply and confine liquid between a projection system configured to direct a patterned beam of radiation at a target portion of a substrate, and an underlying substantially planar surface, the underlying surface comprising two parts having a gap defined therebetween, and removing liquid from the gap using a fluid extraction system comprising a plurality of openings arranged in a pattern.

The method may comprise moving the gap under the fluid handling structure a plurality of times, the moving only being in a first direction. The plurality of openings may be in a sidewall surface of at least one of the two parts. Each opening may be an aperture of an extraction channel. Each opening may be connected to a collector channel, the collector channel being common to at least two openings, desirably all the openings. The volume of collector channel may be substantially larger than the combined volume of a plurality of extraction channels connecting the openings to the collector channel. An extraction rate out of the collector channel may be such that the pressure drop over each of a plurality of extraction channels connecting the openings to the collector channel is larger than the capillary pressure of liquid in each extraction channel. The collector channel may be in the part in which the openings are present.

In an embodiment, there is provided a lithographic apparatus comprising: a projection system; a first object, a second object and a controller. The controller is configured to control movement of the first and second objects in the apparatus such that when the first object replaces the second object under the projection system both objects always move in substantially the same direction and when the second object replaces the first object under the projection system both objects always move in substantially the same direction.

In an embodiment, there is provided a device manufacturing method comprising using a fluid handling structure to supply and confine liquid between a projection system configured to direct a patterned beam of radiation at a target portion of a substrate, and an underlying substantially planar surface, the underlying surface comprising two parts having a gap defined therebetween, and moving the gap under the fluid handling structure a plurality of times, the moving only being in a first direction.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

What is claimed is:

1. An immersion lithographic apparatus, comprising:
   a substrate table configured to support a substrate;

a shutter member having a top surface, wherein, when the shutter member is adjacent the substrate table, the top surface is substantially co-planar with a surface of the substrate table and/or the substrate and the surfaces of the shutter member and the substrate table are spaced apart by a gap;

a fluid handling structure configured to supply and confine a liquid between a projection system and (i) the substrate, or (ii) the substrate table, or (iii) a surface of the shutter member, or (iv) any combination selected from (i)-(iii); and a fluid extraction system configured to remove at least some of the liquid from the gap through an extraction opening in a sidewall surface of the shutter member and/or in a sidewall surface of the substrate table, the sidewall surface having an orientation different from a top surface of the substrate when supported by the substrate table and having at least a portion thereof extending diagonally to undercut the respective top surface of the shutter member and/or the surface of the substrate table, the extraction opening having an orientation with at least a vertical direction component, and the sidewall surface having a ledge that is below the extraction opening, is at least partly underneath the diagonal portion, and extends away from the extraction opening such that an outer edge of the ledge is laterally spaced apart from the other of the shutter member or the substrate table.

2. The apparatus of claim 1, wherein the shutter member is a second table.

3. The apparatus of claim 2, wherein the second table is a second substrate table or a measuring table.

4. The apparatus of claim 1, wherein the shutter member is a bridge between the substrate table and a second table.

5. The apparatus of claim 4, wherein the bridge is a retractable bridge.

6. The apparatus of claim 1, wherein the extraction opening is a plurality of extraction openings, each opening being defined in the sidewall surface.

7. The apparatus of claim 6, wherein the sidewall surface of the gap surrounding the openings is lyophilic.

8. The apparatus of claim 6, wherein at least part of a surface of the gap is lyophobic.

9. The apparatus of claim 6, wherein each extraction opening is an aperture of an extraction channel and wherein each extraction channel is connected to a collector channel, the collector channel being common to at least two extraction channels of the plurality of extraction channels.

10. The apparatus of claim 9, wherein the collector channel is in the substrate table or shutter member in which the extraction opening is formed.

11. The apparatus of claim 9, wherein a volume of the collector channel is substantially larger than a combined volume of the extraction channels.

12. The apparatus of claim 9, further comprising a controller configured to control a flow rate out of the collector channel such that a pressure drop over each of the extraction channels is greater than a capillary pressure generated by the liquid being present in an extraction channel.

13. The apparatus of claim 12, wherein the controller is configured to control the flow rate out of the collector channel such that the pressure drop over each of the extraction channels is at least 5 times greater than a pressure drop over the collector channel.

14. The apparatus of claim 1, further comprising a controller configured to control movement of objects in the apparatus such that the gap moves under the fluid handling structure in only a first direction.

15. The apparatus of claim 1, comprising a plurality of extraction openings arranged in the gap in a pattern along an edge of the substrate table, or the shutter member, or both.

16. The apparatus of claim 1, wherein the sidewall surface is oriented at an angle with regard to the top surface of the substrate, the angle being substantially different from 0° or substantially different from 90°.

17. An immersion lithographic apparatus, comprising:
a substrate table configured to support a substrate;
a fluid handling structure configured to supply and confine liquid between a projection system configured to direct a patterned beam of radiation at a target portion of the substrate, and the substrate, or the substrate table, or both; and
a fluid extraction system configured to remove liquid from a gap between the substrate and the substrate table, and comprising a plurality of extraction openings to extract liquid, the extraction openings being defined in a surface of the gap and each defining a two-dimensional aperture plane in a plane of the surface, the surface of the gap having an orientation different from a top surface of the substrate when supported by the substrate table and the two-dimensional aperture planes having an orientation with at least a vertical direction component,
wherein the substrate table comprises an opening to the gap defined in a surface that is below the plurality of extraction openings, is transverse to the surface of the gap and is connected via a passage through the substrate table to the atmosphere.

18. The apparatus of claim 17, wherein the surface is oriented at an angle with regard to the top surface, the angle being substantially different from 90°.

19. The apparatus of claim 17, wherein each extraction opening is an aperture of an extraction channel and wherein each extraction channel is connected to a collector channel in the substrate table, the collector channel being common to at least two extraction channels of the plurality of extraction channels.

20. The apparatus of claim 17, wherein the surface of the gap surrounding the openings is lyophilic.

* * * * *

UNITED STATES PATENT AND TRADEMARK OFFICE
CERTIFICATE OF CORRECTION

PATENT NO. : 9,176,393 B2  
APPLICATION NO. : 12/472099  
DATED : November 3, 2015  
INVENTOR(S) : Hendricus Marie Cloin et al.

Page 1 of 1

It is certified that error appears in the above-identified patent and that said Letters Patent is hereby corrected as shown below:

ON THE TITLE PAGE

On Page 3, Column 1, Item (56) References Cited - Foreign Patent Documents, Line 12
replace "EP   1 486 027 A3   3/2005"
with --EP   1 486 827 A3   3/2005--.

On Page 3, Column 2, Item (56) References Cited - Foreign Patent Documents, Line 45
replace "WO   WO 2004/093169 A2   10/2004"
with --WO   WO 2004/093159 A2   10/2004--.

Signed and Sealed this
Twenty-second Day of March, 2016

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 9,176,393 B2 | |
| APPLICATION NO. | : 12/472099 | |
| DATED | : November 3, 2015 | |
| INVENTOR(S) | : Christian Gerardus Norbertus Hendricus Marie Cloin | |

It is certified that error appears in the above-identified patent and that said Letters Patent is hereby corrected as shown below:

ON THE TITLE PAGE

On Page 3, Column 1, Item (56) References Cited - Foreign Patent Documents, Line 12
  replace "EP    1 486 027 A3    3/2005"
  with --EP    1 486 827 A3    3/2005--.

On Page 3, Column 2, Item (56) References Cited - Foreign Patent Documents, Line 45
  replace "WO    WO 2004/093169 A2    10/2004"
  with --WO    WO 2004/093159 A2    10/2004--.

This certificate supersedes the Certificate of Correction issued March 22, 2016.

Signed and Sealed this
Tenth Day of May, 2016

Michelle K. Lee
*Director of the United States Patent and Trademark Office*